(12) United States Patent
Leong et al.

(10) Patent No.: US 9,093,229 B2
(45) Date of Patent: Jul. 28, 2015

(54) ILLUMINATED KEYBOARD

(71) Applicant: Apple Inc., Cupertino, CA (US)

(72) Inventors: Craig C. Leong, San Jose, CA (US);
James J. Niu, San Jose, CA (US); Keith J. Hendren, San Francisco, CA (US);
John M. Brock, San Francisco, CA (US); Thomas W. Wilson, Jr., Saratoga, CA (US); Brad Patton, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 477 days.

(21) Appl. No.: 13/723,054

(22) Filed: Dec. 20, 2012

(65) Prior Publication Data

US 2013/0162450 A1    Jun. 27, 2013

Related U.S. Application Data

(60) Provisional application No. 61/578,687, filed on Dec. 21, 2011.

(51) Int. Cl.
*H01H 13/02* (2006.01)
*H01H 3/12* (2006.01)
(Continued)

(52) U.S. Cl.
CPC ............. *H01H 3/125* (2013.01); *H01H 13/023* (2013.01); *H01H 13/703* (2013.01); *H01H 13/7065* (2013.01); *H01H 13/88* (2013.01); *H03K 17/98* (2013.01); *H01H 2209/064* (2013.01); *H01H 2211/004* (2013.01); *H01H 2219/036* (2013.01);
(Continued)

(58) Field of Classification Search
CPC .. H01H 5/125; H01H 13/7065; H01H 13/023
USPC ....................................................... 362/23.03
See application file for complete search history.

(56) References Cited

U.S. PATENT DOCUMENTS

| 5,278,371 A | 1/1994 | Watanabe et al. |
| 5,746,308 A | 5/1998 | Lin |

(Continued)

FOREIGN PATENT DOCUMENTS

WO     WO 99/24962     5/1999

OTHER PUBLICATIONS

U.S. Appl. No. 13/407,910, filed Feb. 29, 2012, Niu.

(Continued)

*Primary Examiner* — David V Bruce
(74) *Attorney, Agent, or Firm* — Brownstein Hyatt Farber Schreck, LLP

(57) ABSTRACT

In a first embodiment, an input device includes at least one keycap, a support mechanism configured to move the keycap from a first position to a second position, a feature plate having at least one anchoring mechanism operably connected to the support mechanism, and an illumination panel. The illumination panel is positioned between the at least one keycap and the feature plate. The at least one anchoring member extends through a portion of the illumination panel. In a second embodiment, an input device includes a keycap, a support mechanism configured to move the keycap, a support plate operably connected to the support mechanism, and an illumination panel. The illumination panel includes a light source, a light guide, and a frame substantially surrounding the light guide. Light illuminated from the light source is directed by the light guide and the frame towards the keycap.

20 Claims, 36 Drawing Sheets

(51) Int. Cl.
　　*H01H 13/7065*　　(2006.01)
　　*H01H 13/88*　　(2006.01)
　　*H03K 17/98*　　(2006.01)
　　*H01H 13/703*　　(2006.01)

(52) U.S. Cl.
　　CPC ...... *H01H 2219/062* (2013.01); *H01H 2227/01* (2013.01); *H01H 2229/028* (2013.01); *Y10T 29/49002* (2015.01); *Y10T 29/49105* (2015.01)

(56) References Cited

U.S. PATENT DOCUMENTS

| | | |
|---|---|---|
| 5,986,227 A | 11/1999 | Hon |
| 5,997,196 A | 12/1999 | Hu |
| 6,040,540 A | 3/2000 | Tsai et al. |
| 7,239,303 B2 * | 7/2007 | Liao et al. ............ 345/168 |
| 7,842,895 B2 | 11/2010 | Lee |
| 8,110,764 B2 | 2/2012 | Hsu et al. |
| 8,912,458 B2 | 12/2014 | Peterson et al. |
| 2009/0294268 A1 | 12/2009 | Hsu et al. |
| 2010/0108486 A1 | 5/2010 | Yoshida |
| 2011/0155552 A1 | 6/2011 | Wang |
| 2011/0260978 A1 | 10/2011 | Larsen |
| 2013/0161171 A1 | 6/2013 | Leong et al. |
| 2013/0161172 A1 | 6/2013 | Leong et al. |
| 2013/0162450 A1 | 6/2013 | Leong et al. |
| 2013/0220786 A1 | 8/2013 | Niu |

OTHER PUBLICATIONS

U.S. Appl. No. 13/722,993, filed Dec. 20, 2012, Leong et al.
U.S. Appl. No. 13/723,033, filed Dec. 20, 2012, Leong et al.
International Search Report and Written Opinion dated Oct. 11, 2013, PCT/US2012/070670, 13 pages.

* cited by examiner

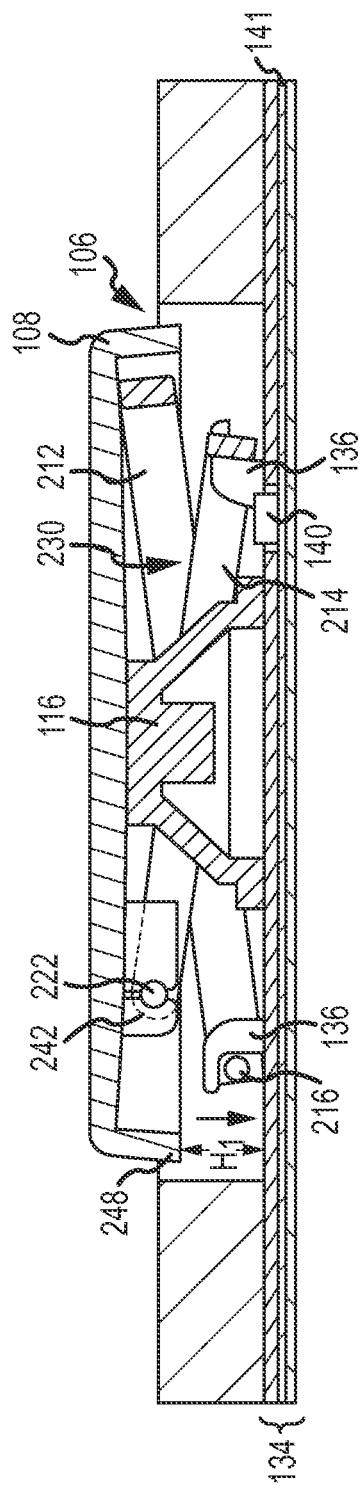

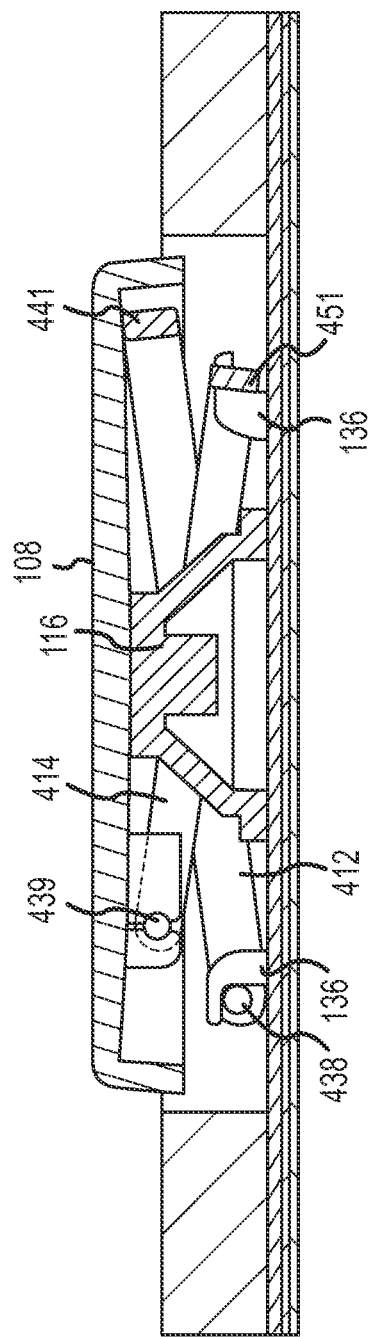

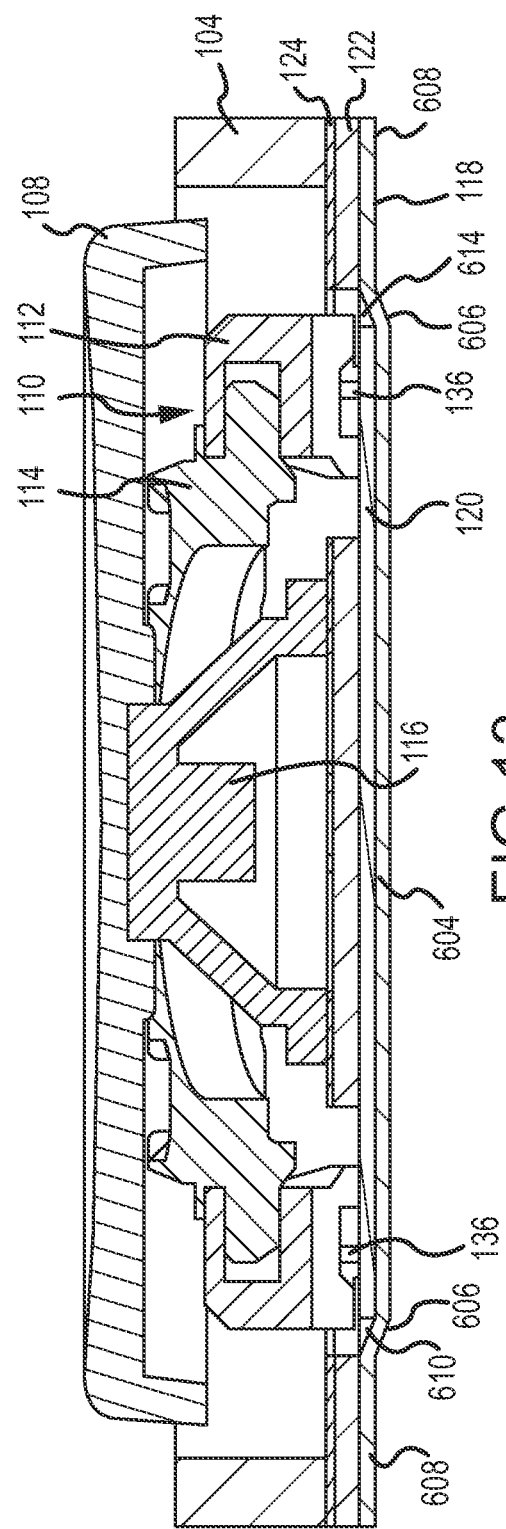

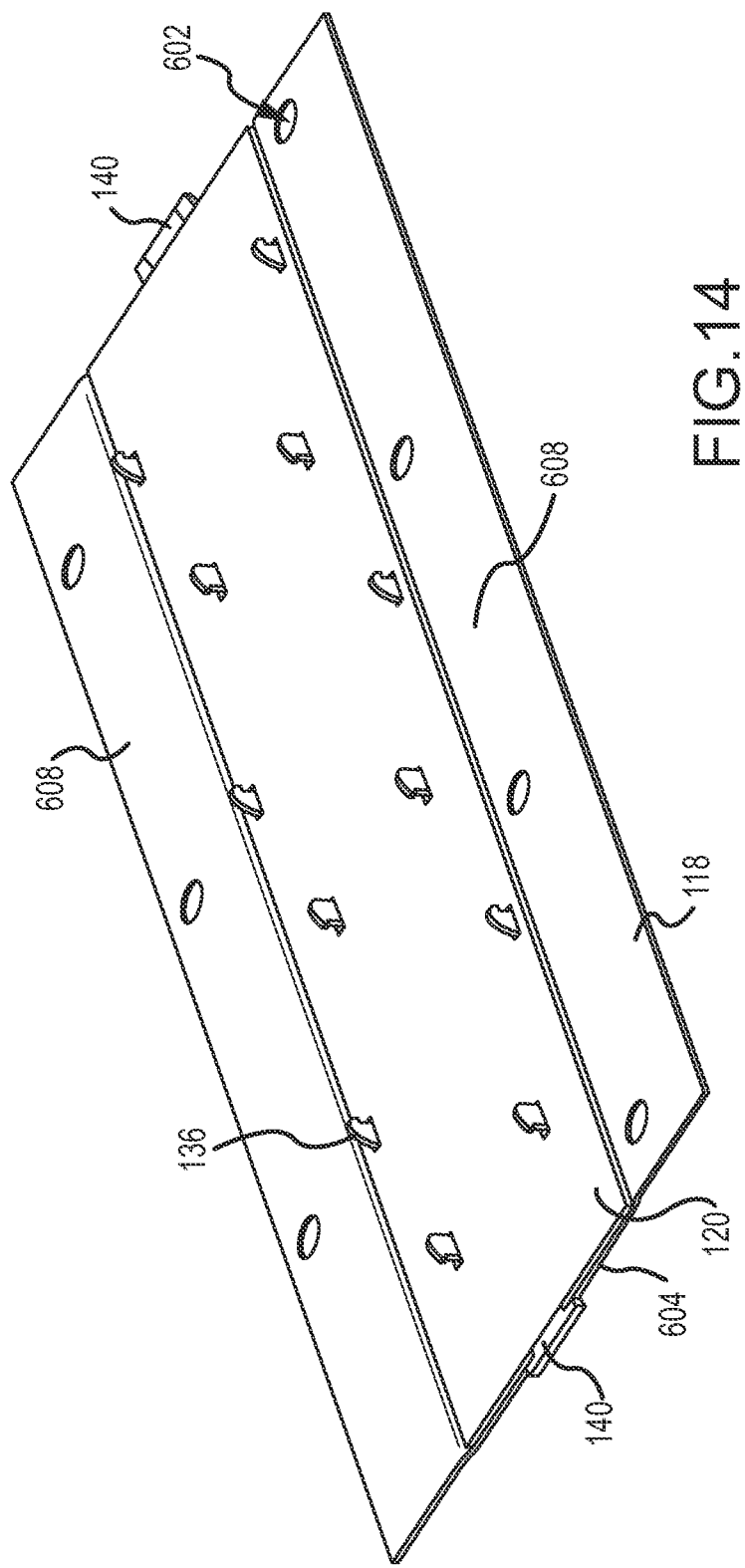

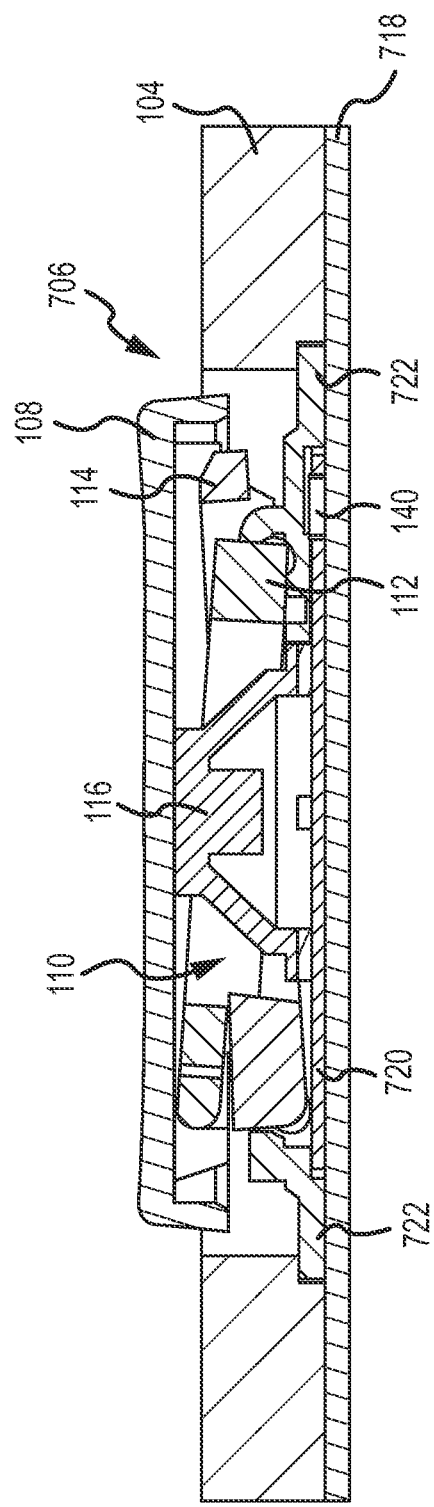

ILLUMINATED KEYBOARD

CROSS-REFERENCE TO RELATED APPLICATION

The present application claims the benefit under 35 U.S.C. §119(e) to U.S. Provisional Patent Application No. 61/578,687, which was filed on Dec. 21, 2011, and entitled "Keyboard Mechanisms for Electronic Devices," which is incorporated by reference as if fully disclosed herein.

TECHNICAL FIELD

The present invention relates generally to electronic devices, and more specifically to input devices for electronic devices.

BACKGROUND

Computers and other electronic devices typically include one or more input devices, such as mice, keyboards, joysticks, and the like so a user can more easily interact with the device in question. Often, these input devices may be integrated with or into the associated electronic device. For example, a laptop computer may include a keyboard operably connected to its internal systems and housed within its enclosure. Similarly, a laptop computer may also include a track pad or other motion-based input device that may also be integrated with the enclosure.

In some instances, it may be desirable to reduce the size of some computers or other electronic devices. For example, smart phones and laptops may be designed to be as small and light as possible. However, many input devices may consume a substantial amount of interior space of the associated computing device. For example, many conventional keyboards have a mechanical scissor mechanism that translates each key vertically by a predetermined distance, as well as other mechanical layers that, taken together form a key stack. Thus, the height of the device's enclosure may be limited by the vertical travel range of the keys, as well as the thickness or height of the key stack.

SUMMARY

In a first embodiment, an input device includes at least one keycap, a support mechanism configured to move the keycap from a first position to a second position, a feature plate having at least one anchoring mechanism operably connected to the support mechanism, and an illumination panel. The illumination panel is positioned between the at least one keycap and the feature plate. The at least one anchoring member extends through a portion of the illumination panel. The input device may include additional keycaps and the illumination panel may direct or emit light toward one or more of the additional keycaps.

In various implementations of this first embodiment, the feature plate may include a channel. The illumination panel may be positioned in the channel. The channel may include a base member with parallel angular extensions that extend upwardly from sides of the base member and are connected to leg members that are substantially parallel to the base member. Spaces may be defined between the illumination panel and a top corner formed by one or more of the angular extensions and leg members.

In one or more implementations of this first embodiment, the illumination panel may be operably connected to the feature plate utilizing adhesive, one or more fasteners, one or more of the anchoring members, and so on. The anchoring member may form a barrier wall for the illumination panel that reflects light either toward the keycap or back toward the illumination panel. The anchoring member may prevent light from the illumination panel from being emitted around a side of the keycap.

In a second embodiment, an input device includes a keycap, a support mechanism configured to move the keycap, a support plate operably connected to the support mechanism, and an illumination panel. The illumination panel includes a light source, a light guide, and a frame substantially surrounding the light guide. Light illuminated from the light source is directed by the light guide and the frame towards the keycap.

In one or more implementations of this second embodiment, the support plate may be a substrate that supports one or more other elements of the input device, such as the support mechanism, keycap, illumination panel, and so on. The substrate may be a printed circuit board or other component that supports one or more electrical connections for the input device, such as one or more electrical connections to a computing device. In some cases, the illumination panel and/or other components of the input device may be incorporated into the support plate.

In some implementations of this second embodiment, the illumination panel may occupy substantially the same area as the keycap. In this case, other keycaps of the input device may not receive light from the illumination panel. Instead, one of more of the other keycaps may receive light from one or more additional illumination panels.

In various implementations of this second embodiment, the frame may be composed of a material that is not light transmissive. The frame may prevent light leakage from around the keycap and/or reflect towards the keycap or back towards the illumination panel. In some cases, one or more retaining features may secure the frame to the illumination panel.

BRIEF DESCRIPTION OF THE DRAWINGS

FIG. 5 is a cross-section view of the key taken along line 5-5 in FIG. 4A.

FIG. 11 is a cross-section view of the key taken along line 11-11 in FIG. 10A.

FIG. 13 is a cross-section view of the key taken along line 13-13 in FIG. 12A.

FIG. 14 is a perspective view of the illumination panel and the feature plate for a row of three keys.

FIG. 17 is a cross-section view of the key taken along line 17-17 in FIG. 16B.

SPECIFICATION

Overview

Figure 1:
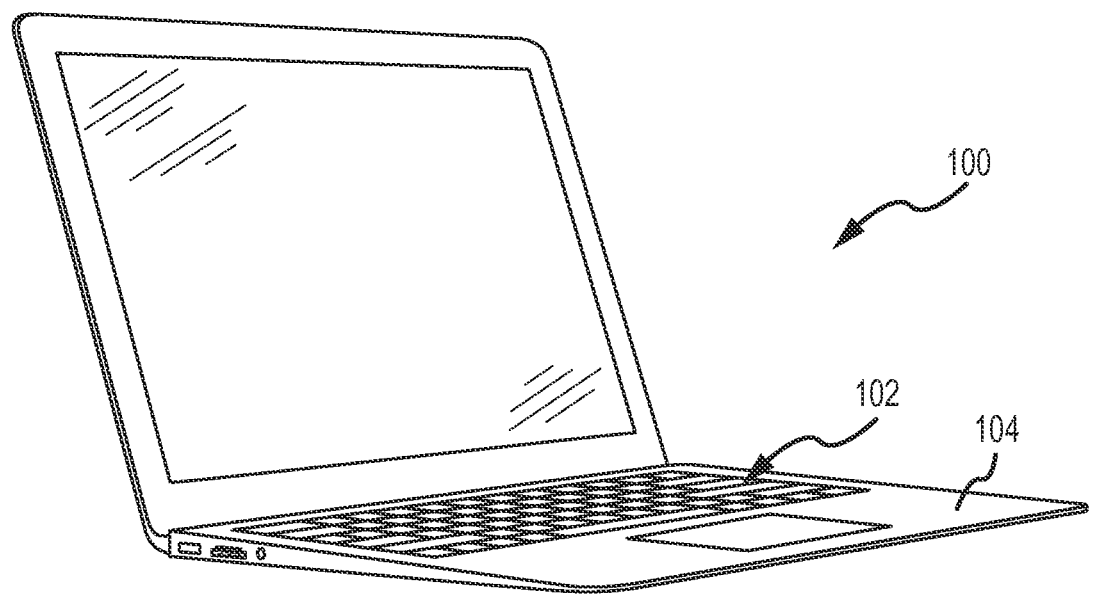
FIG. 1 is a perspective view of a computing device including a keyboard.

Some embodiments described herein may take the form of a keyboard for an electronic device or computing device; these two terms are used generally interchangeably. The keyboard may provide user input to the computing device and may include different keys, buttons, or switches that may represent different inputs to the computing device. For example, each of the keys may include a legend or symbol, such as alphanumeric symbols and/or words; the corresponding input may be initiated within the computing device when the key is pressed. The keyboard may be in communication with the computing device and may be integrated with or external to the computing device. In one embodiment, the keyboard may be operably connected to an enclosure of the computing device.

Each of the keys of the keyboard may be made of a key stack, which may include a feature or anchoring plate, a light guide or illumination panel, a sensor membrane, a top layer, a support mechanism, a haptic device, and a key cap. The feature plate may support the key, and in some instances may be operably connected to the enclosure of the computing device. The keycap may sit on top of the support mechanism, which supports the key cap above the feature plate and allows the key cap to travel vertically relative to the feature plate. The haptic device may provide feedback to the user when an input is provided to the key cap. For example, the haptic device may be a compressible dome that provides a tactile feel on the key for the user. The illumination panel may provide illumination for the key and/or keyboard. The sensor membrane(s) may provide input to the computing device that a key has been depressed.

In some embodiments, the keys of the keyboard may have a vertical travel motion relative to the enclosure of the computing device. When the user provides a downward force on the key cap, the keycap may travel downward while supported by the support mechanism. In one embodiment, the support mechanism may be one or more supports interconnected together. In some embodiments, the supports of the support mechanism may be formed of a rigid material to substantially prevent the keycap from bending or tilting when a downward force is exerted on a portion or an entire area of the keycap. In these embodiments, the supports may allow the keycap to move vertically while remaining substantially parallel to the feature plate. In these embodiments, the support mechanism may have some lateral motion that translates into the vertical motion of the keycap. For example, in one embodiment, a first support of the support mechanism may slide relative to a second support and thus as the keycap travels vertically, the support mechanism travels both laterally and vertically.

The lateral motion of the support or scissor mechanism may allow the keyboard to have a reduced thickness as compared to conventional keyboards. This is because scissor mechanisms for conventional keyboards typically suffer from some torsional twisting if a keycap is pressed at an edge or corner. That is, if a user presses a corner of the keycap, that corner may travel downward more than other parts of the keycap, such as the opposing corner. This torsional or bending motion may require an increased travel distance between the keycap and the feature plate in order to prevent the corner from bottoming out before an input is registered. As the support mechanism of the current disclosure may reduce or eliminate bending, and translate some vertical force into a lateral motion of the support mechanism, the travel distance may be reduced, allowing a thickness of the keyboard to be reduced.

Other embodiments of the keyboard may include an illumination panel (e.g., light guide) and/or illumination mechanisms for the keyboard. In one embodiment, the illumination panel may be optically coupled to a light source and be positioned above the feature (or anchoring) plate. In typical illuminated keyboards, the feature plate is positioned above the illumination mechanism in order to better provide a mechanical connection for the keys and to better sense when a particular key is depressed.

The feature plate may include electrical connections for keys, such as switches to register input when a key is pressed. However, in conventional keyboards, the feature plate may block a significant portion of light that would otherwise illuminate one or more keycaps. Accordingly, as in some embodiments of the present disclosure, the illumination panel may be positioned above or integrated with the feature plate so that light may have a more direct path towards the desired area for illumination, e.g., a back surface of the key cap. Thus, less light may be required to provide the same amount of illumination, which may provide power savings for the keyboard. Further, the illumination panel and/or light source may be more efficient as a larger percentage of light may be directed towards the target surface, without having to travel around an obstruction or be re-directed.

In yet other embodiments, the keyboard may include a sensing member for sensing when a user has selected or depressed a key. The sensing member may not require mechanical actuation in order to detect a user input. For example, the sensing member may be configured to detect changes in capacitance. In one embodiment, a capacitive sensor layer may be positioned within the key stack so to detect when a user has depressed or touched the key cap. In these embodiments, the keyboard may be able to detect any or all of: the keycap approaching the feature plate; varying forces applied to the keycap; and the position or presence of fingers on the various keycaps.

DETAILED DESCRIPTION

Turning to the figures and as described briefly above, the keyboard may be incorporated with a computing device. FIG. 1 is a perspective view of a computing device 100 having a keyboard 102 incorporated therein. The computing device 100 may be substantially any type of computing device 100, such as a laptop computer, desktop computer, smart phone, portable gaming device, and so on. Additionally, it should be noted that although the keyboard 102 is illustrated in FIG. 1 as being integrated with the computing device 100, in other embodiments, the keyboard 102 may be separate from the computing 100. For example, the keyboard 102 may be a standalone unit and substantially self contained. In these embodiments, the keyboard 102 may include a communication device (e.g., cable, wireless interface) for transferring data to and from the computing device 100.

In some embodiments, the computing device 100 may further include an enclosure 104 substantially surrounding the keyboard 102. In embodiments where the keyboard may be physically separate from the computing device, the enclosure 102 may at least partially surround the keyboard 102 and may be operably connected to the keyboard 102 as discussed in more detail below with respect to FIG. 22. In some embodiments, the enclosure 104 may define multiple apertures, each of which may receive one or more keys 106 of the keyboard 102. However, in other embodiments, the enclosure 104 may define a single aperture or fewer apertures than the number of keys, so that the entire keyboard 102 may be received within a single aperture or groups of keys may be received through group apertures.

The keyboard 102 may include multiple keys 106 of varying sizes and/or shapes. Additionally, each of the keys 106 may include a symbol or indicator on a top surface of a keycap. For example, the symbol (not shown) for each key 106 may be painted, etched, or illuminated through the keycap 106 through an aperture or transparent portion. Each of the keys 106 may represent one or more different inputs, and as each key 106 is depressed by a user, the key 106 may provide an input to the computing device 100. For example, the keys 106 may include a sensor to detect when it is depressed, and the sensor may transmit a signal to a processor within the computing device 100 indicating that the key 106 has been depressed or otherwise selected. In other embodiments, as the key is depressed, it may complete a switch circuit indicating that the key has been selected.

Figure 2A:
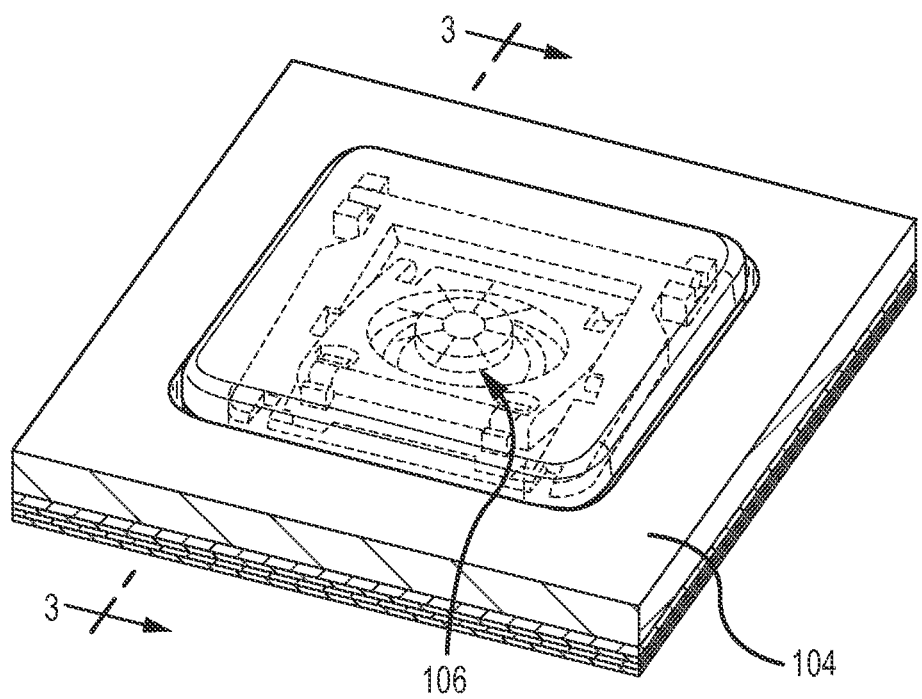
FIG. 2A is a perspective view of a section of the computing device including a key of the keyboard.
Figure 2B:
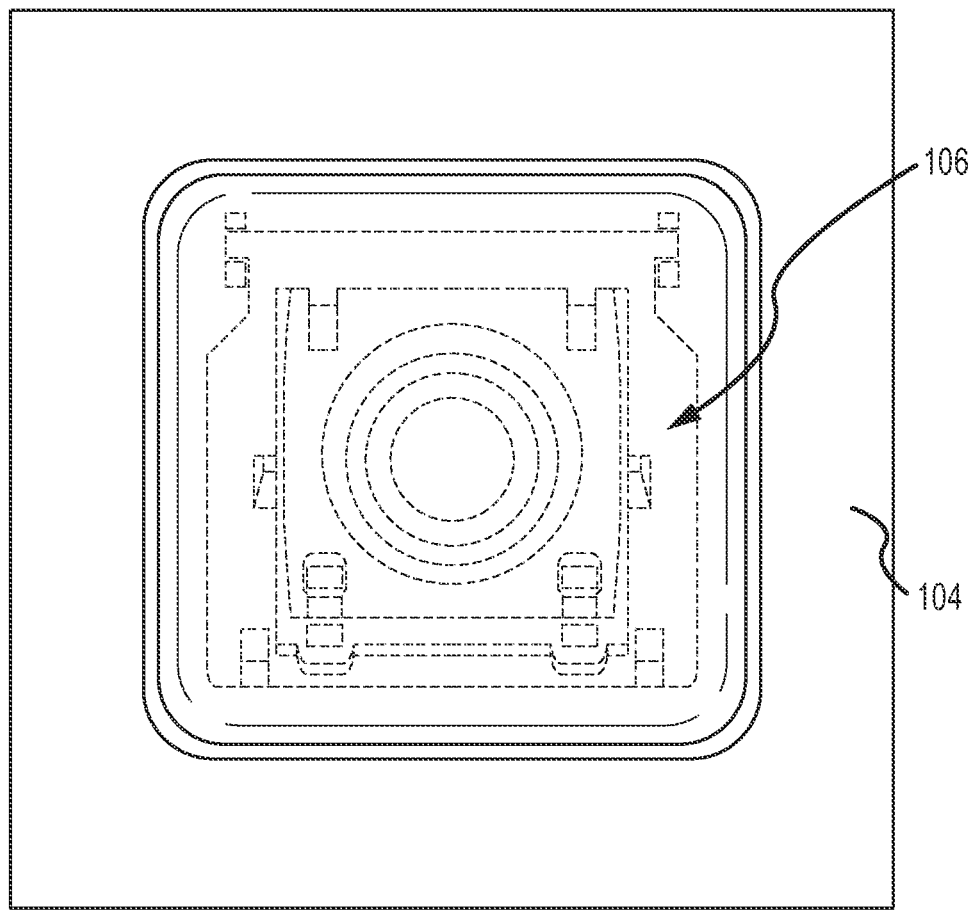
FIG. 2B is a top plan view of the key of FIG. 2A.
Figure 3:
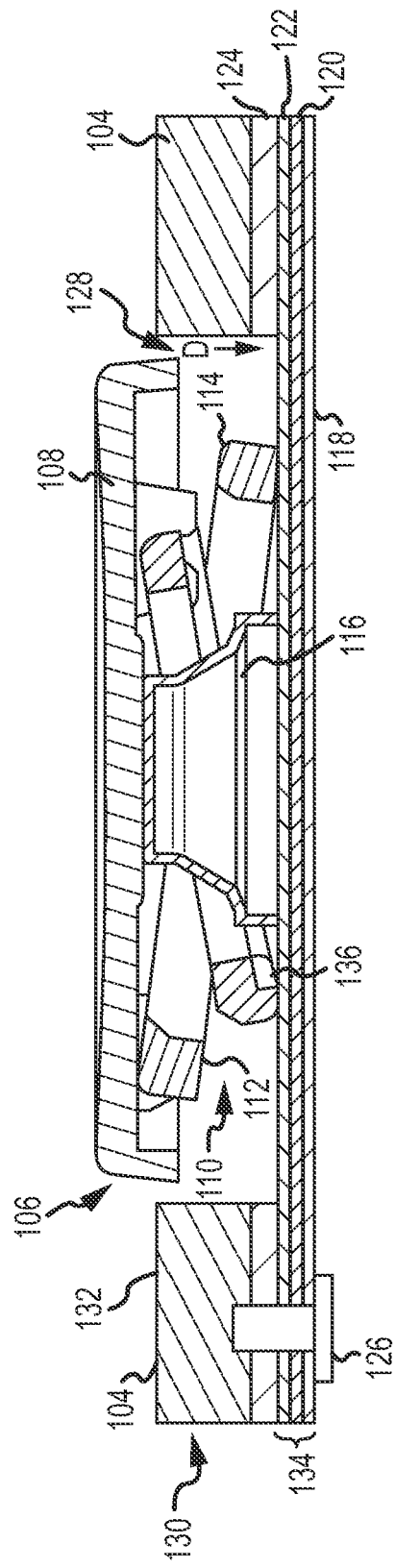
FIG. 3 is a cross-section view of the key taken along line 303 in FIG. 2A.

The keys 106 of the keyboard 102 will now be discussed in more detail. FIG. 2A is a perspective view of the key 106 removed from the keyboard 102 and the computing device 100. FIG. 2B is a top plan view of the key 106. FIG. 3 is a cross-sectional view of the key 106 taken along line 3-3 in FIG. 2A. As briefly described above, the enclosure 104 may define a key aperture 128 in which the key 106 is positioned. The enclosure 104 may also surround the key 106, but as shown in FIG. 3, the key aperture 128 may be slightly larger than the key 106, so that the key 106 may be able to move vertically within the key aperture 128. In some embodiments, the key 106 may have a resting or normal position where a keycap 108 may be positioned even with or slightly higher than a top surface 132 of the enclosure 104. As a user depresses the key 106, the key 106 may translate downward, as shown in FIG. 3 by arrow D, with respect to the top surface 132 of the enclosure 104.

Referencing FIG. 3, the key 106 may include a keycap 108 supported by a support mechanism 110. The support mechanism 110 supports the keycap 108 over a base 134 with a haptic device 116 positioned within a cavity defined by the support mechanism 110 and below the keycap 108. The support mechanism 110 or scissor mechanism is discussed in more detail with respect to FIGS. 4A-12. Briefly, the support mechanism 110 may include a first support 112 and a second support 114 both of which may be operably connected to the base 134. The supports 112, 114 cooperate to translate the keycap 108 vertically within the key aperture 128 in response to a downward force on the keycap. In some embodiments, the support mechanism 110 may be operably connected to a bottom surface of the keycap 108, so that as a force is exerted on the keycap 108, the force may also be transferred to the support mechanism 110. Additionally, the support mechanism 110 may attach to the base 134 by one more anchoring members 136 that anchor the support mechanism 110 to the base 134. Thus, the first and second supports 112, 114 may move vertically, but may be substantially prevented or at least somewhat limited in lateral motion.

The haptic device 116 may be substantially any type of device capable of providing feedback to a user in response to the user touching and/or applying a force to the key 106. In one embodiment, the haptic device 116 is a compressible dome that may be bonded or otherwise connected to one or more layers of the base 134. For example, the dome may mechanically compress as the user provides a downward force on the keycap 116, providing feedback to the user. In one embodiment, the haptic device 116 is operably connected to a sensor membrane layer 122. In these embodiments, the haptic device 116 may also function to provide an input to the sensor membrane 122 indicating that the key 106 has been selected. For example, the haptic device 116 may complete a circuit or switch within the sensor membrane 122 and/or the illumination panel 120. Or, as discussed in more detail below with respect to FIG. 21, the haptic device 116 may be in communication with a sensing member that may detect changes in position of the haptic device 116.

Figure 22:
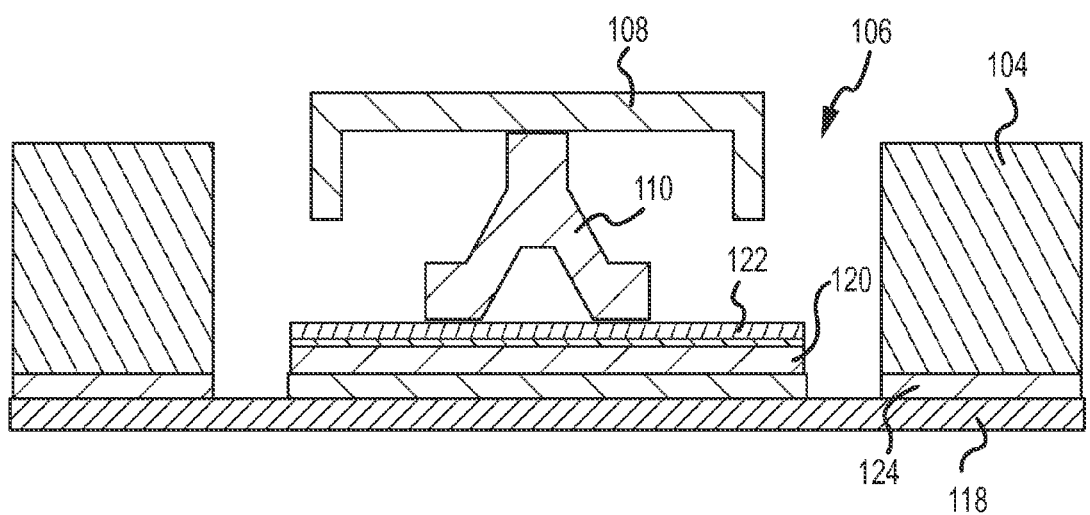
FIG. 22 is a cross-section view of the key illustrating an adhesive layer with certain features hidden for clarity.

The base 134 may be operably connected to the enclosure 104 through a fastener 126 and/or by adhesive 124 (discussed in more detail below with respect to FIG. 22). In some embodiments, as the key 106 is operably connected to the base 134 (through the support mechanism 110 and/or the haptic device 116), the base 134 may operably connect the key 106 to the enclosure 104. The base 134 may include a feature plate 118, an illumination panel 120, and/or a sensor membrane 122. The various elements of the base 13 may be connected to each other or separately connected to other elements of the keyboard 102. Furthermore, in some embodiments, one or more of the layers may be combined with one or more the other layers of the base 134. For example, as shown in FIG. 13, the illumination panel 120 may be combined with the feature plate 118 to reduce the height of the base 134 and keyboard stack 130.

The feature plate 118 may form a bottom of the key stack 130 and may operably and/or communicatively connect the key 106 to the computing device 100. For example, the feature plate 118 may include contacts (not shown) for transmitting electrical signals. Furthermore, the feature plate 118 may also include anchoring members 136 that secure the support mechanism 110 in position. For example, the anchoring members 136 may secure to one or both of the supports 112, 114.

The illumination panel 120 may provide illumination for the key 106 and/or other portions of the keyboard 102 and will be discussed in further detail below with respect to FIGS. 14A-20. In some embodiments, the illumination panel 120 may be positioned above the feature plate 118 and below the sensor membrane 122. In other words, the illumination panel 120 may form an intermediate layer of the base 134. Also, in some embodiments, the illumination panel 120 may be further combined with one or more sensors to form a sensor layer within the base 134. In these embodiments, the sensor membrane 122 may form a top layer for the sensors within the illumination panel 120. In yet other embodiments, the illumination panel 120 may be omitted and a sensor layer (either combined with the sensor membrane 122 or separate therefrom) may be included.

The sensor membrane 122 may form a top layer of the base 134. In some embodiments, the sensor membrane 122 may form a protective layer between the sensors in the illumination panel 120 (or intermediate layer if no illumination is desired). Also, in some embodiments, the sensor membrane 122 may include one or more sensors for detecting whether the key 106 has been selected by a user. Various elements of the keyboard will now be discussed in further detail.

Support Mechanism

Figure 4A:
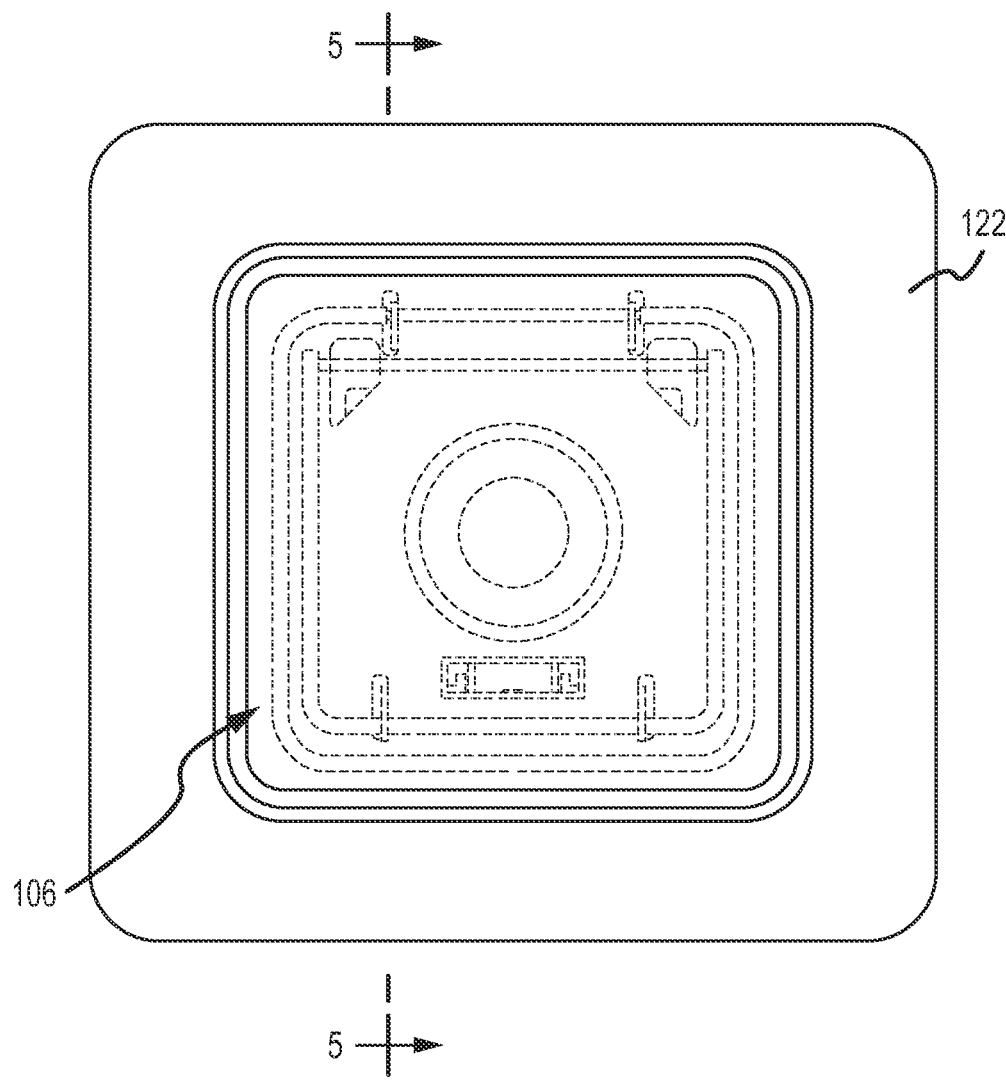
FIG. 4A is a top plan view of the key having a first embodiment of a support mechanism.
Figure 4B:
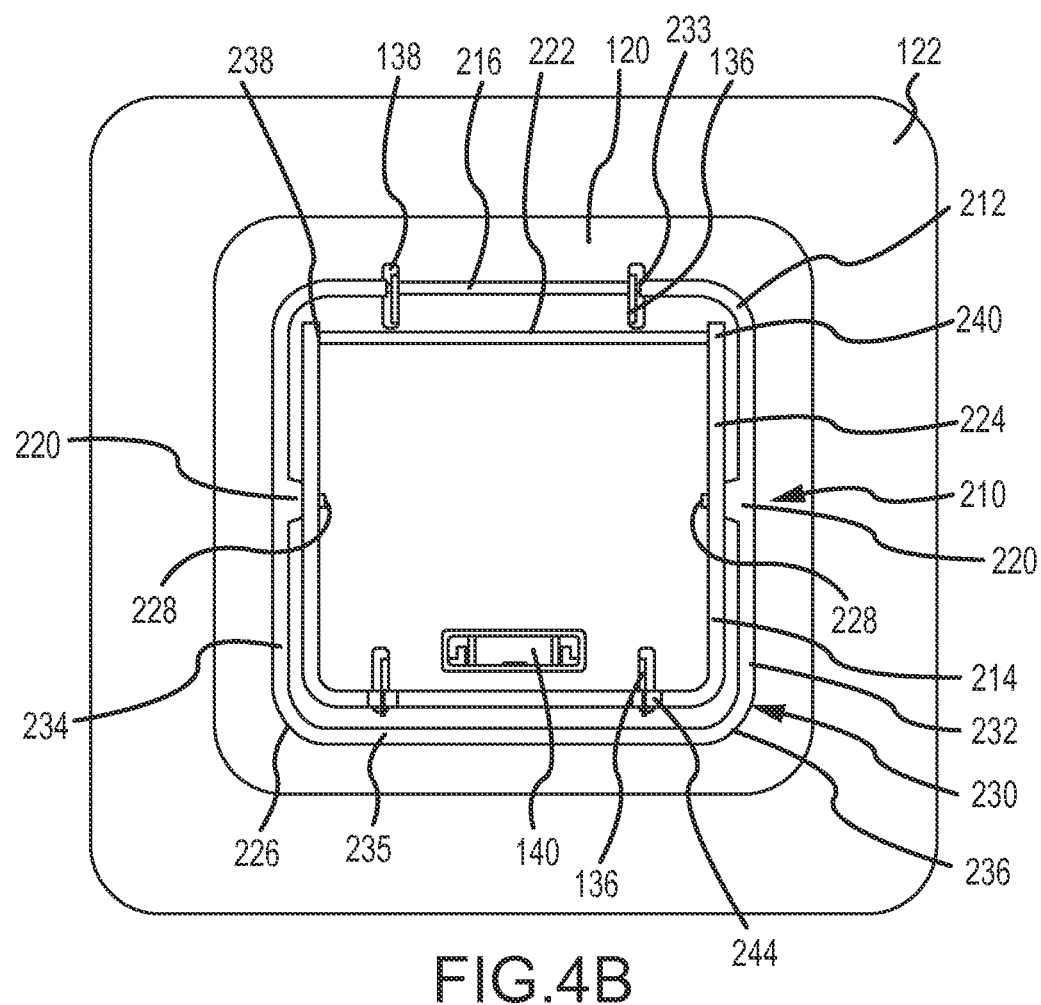
FIG. 4B is a top plan view of the key of FIG. 4A with a keycap removed to illustrate certain features.

The support mechanism 110 will now be discussed in more detail. FIG. 4A is a top plan view of the key 106 including a first embodiment of the support mechanism 110 removed from the enclosure 104. FIG. 4B is a top plan view of the key 106 with the keycap 108 and haptic device 116 removed for clarity. FIG. 5 is a cross-section view of the key 106 of FIG. 4A. The support mechanism 210 in this embodiment may include a first support 212 and a second support 214. The supports 212, 214 may be operably connected to the feature plate 118 by the anchoring members 136. The anchoring members 136 may extend through apertures 138 formed within the illumination panel 120 to interact with each of the supports 212, 214, securing them to the feature plate 118. The supports 212, 214 may also be operably connected to the keycap 108.

In some embodiments each of the supports 212, 214 may be created out of generally rigid material, such as but not limited to, glass filled plastic, metal coated plastic, cast metal, metal injection molded material, or machined metal. In these embodiments, the support structure 210 may be substantially stiffer than conventional scissor mechanisms, which are usually constructed out of plastic. As the support structure 210 is stiffer than conventional scissor mechanisms, the keycap 108 may be less likely to tilt as a force is applied to the top surface. This may allow substantially planar motion as the keycap 108 travels within the receiving aperture 128 of the enclosure 104. Furthermore, the amount of contact with the keycap 108 required to adequately support the keycap 108 may be reduced. For example, scissor mechanisms constructed out of plastic may require more surface area in contact with the keycap 108 to support the same forces as compared to metal or other stiffer materials. The reduced surface area of the support structure 210 may allow for more light, e.g., from the illumination plate 120 or other source, to be transmitted through the keycap 108 without being blocked by portions of the support structure 210.

The support structure 210 may also allow for tighter tolerances than in conventional keyboard scissor mechanisms. This is due to the smaller surface area that may be required to support the same forces exerted on the keycap 108 (allowing smaller diameters). Additionally, the manufacturing techniques for certain metal materials may allow for closer tolerances than typical plastic component techniques.

With reference to FIGS. 4b and 5, the first support 212 may be substantially square or rectangular shaped and may include a brace member 230 and a cross member 216. The cross member 216 may span between two edges 231, 233 of the brace member 230. The brace member 230 may have two side members 232, 234 interconnected together by a bottom member 235. In one embodiment, the brace member 230 may have four rounded corners 226 as it transitions from the side members 232, 234 to the bottom member 235 and as the side members 232, 234 transitions towards the ends 231, 233. The bottom member 235 may be operably connected to a bottom surface of the keycap 108, e.g., by a snap fit, adhesive, or other connection mechanism. In one embodiment, the bottom member 235 may be connected to the keycap 108 at two separate but adjacent locations. In this embodiment, the keycap 108 may be supported at two discrete locations, which may be positioned near two corners of the keycap 108 to better support the entire surface of the keycap 108.

The two side members 232, 234 may be substantially parallel to each other may define a connection member 220 that extends inwards towards the opposite side member 232, 234. The connection member 220 may further include a locking member 228 that operably connects the first support 212 to the second support 214. In one embodiment, the connection member 220 may be a shoulder extending from an inner surface of the side members 232, 234 and the locking member 228 may be a hook or other securing member.

The locking member 228 may create a pivot point for the two supports 212, 214. For example, the locking member 22 may substantially prevent lateral movement of the two supports 212, 214 relative to each other, but may allow vertical movement. In one embodiment, the supports 212, 214 may be interconnected together in an "X" configuration, with the locking member 228 connecting the two at the midpoint of the "X."

With continued reference to FIGS. 4B and 5, in some embodiments, the brace member 230 may have a non-rounded cross section. For example, the brace member 230 may have a square, rectangular, I or T shaped cross-section. In these embodiments, the cross-section area of the brace member 230 may increase the stiffness of the support structure 210, while also decreasing the width required for the support 212 to support the area of the keycap 108. For example, the brace member 230 may have an ideal beam or I-beam shape to provide efficient support with respect to bending and shear forces, with a reduced amount of material and width. By reducing the width of the side members 230-233, the width of the support structure 210 may also be reduced, allowing more light from the illumination plate 120 (or other source) to be transmitted through and around the keycap 108, as the support structure may not block as much of the surface area of the keycap 108.

Opposite of the brace member 230, the cross member 216 may have a generally rounded or circular cross-section. Additionally, the cross member 216 may be operably connected to the feature plate 118 as it may connect to the anchoring members 136. For example, as shown in FIG. 5, the anchoring members 136 may be "L", "J", or other hook-shaped members that may wrap around at least a portion of the cross member 216. In this embodiment, the circular or rounded cross-section of the cross member 216 may allow the first support 212 to move the keycap 108 vertically. For example, the cross member 216 allows the brace member 230 to pivot, while remaining substantially in the same position laterally due to the anchoring member 136. Further, the rounded or circular cross-section of the cross member 22 may provide for better torsion for the support mechanism 210, allowing it to better translate forces exerted on the keycap 108 into vertical motion of the keycap 108.

The second support 214 may be nested within the first support 212 and be operably connected thereto by the locking member 228. The second support 214 may be somewhat similarly shaped to the first support 212 in that it may have a generally square or rectangular structure when positioned flat on the illumination panel 120 or on the sensor membrane 122. The second support 214 may include a cross member 222 interconnected between two ends 238, 240 of a brace member 224. The brace member 224 may be generally shaped as a "U" having a flat bottom, i.e., the brace member 224 may have two generally parallel side members with a bottom member. Additionally, the brace member 224 may have rounded corners 236 as the two parallel side members transition to form the bottom member.

The brace member 224 may be operably connected to the feature plate 118. In some embodiments, the brace member 224 may include connection portions 244 that operably connect to anchoring members 136. The connection portions 244 may have generally rounded cross-section areas, so that the brace member 224 may transition from a non-rounded cross-section to a rounded cross-section at the connection portions 244 or ends 238, 240. However, in some embodiments, the connection portions 244 may have be flat, rounded, or a combination of flat and rounded (e.g., a flat surface having rounded edges or corners). Furthermore, the connections portions 244 may further be a sliding surface or a round surface to allow translation and rotation. Furthermore, in some embodiments, the brace member 224 may be operably connected to the first support member 212. For example, the two parallel side members may be operably connected to the connection members 220 and the locking member 228 may extend around at portion of the side members. By this connection, the two supports 212, 214 may be substantially connected together, such that movement of one support 212, 214 will move the other.

In some embodiments, the cross member 222 may be operably connected to a bottom surface of the keycap 108. For example, the cross member 222 may interact with one or more securing features 242 extending from the bottom surface of the keycap 108. The cross member 222 may have a generally circular or rounded cross-section and the brace member 224 may have a non-rounded cross section, such as a T, I, or rectangular cross-section. The rounded or circular cross sectional may allow the cross member 222 to rotate within the securing features 242, so that the second support 214 may pivot with respect to the feature plate 118, while remaining secured to the feature plate 118.

Figure 6A:
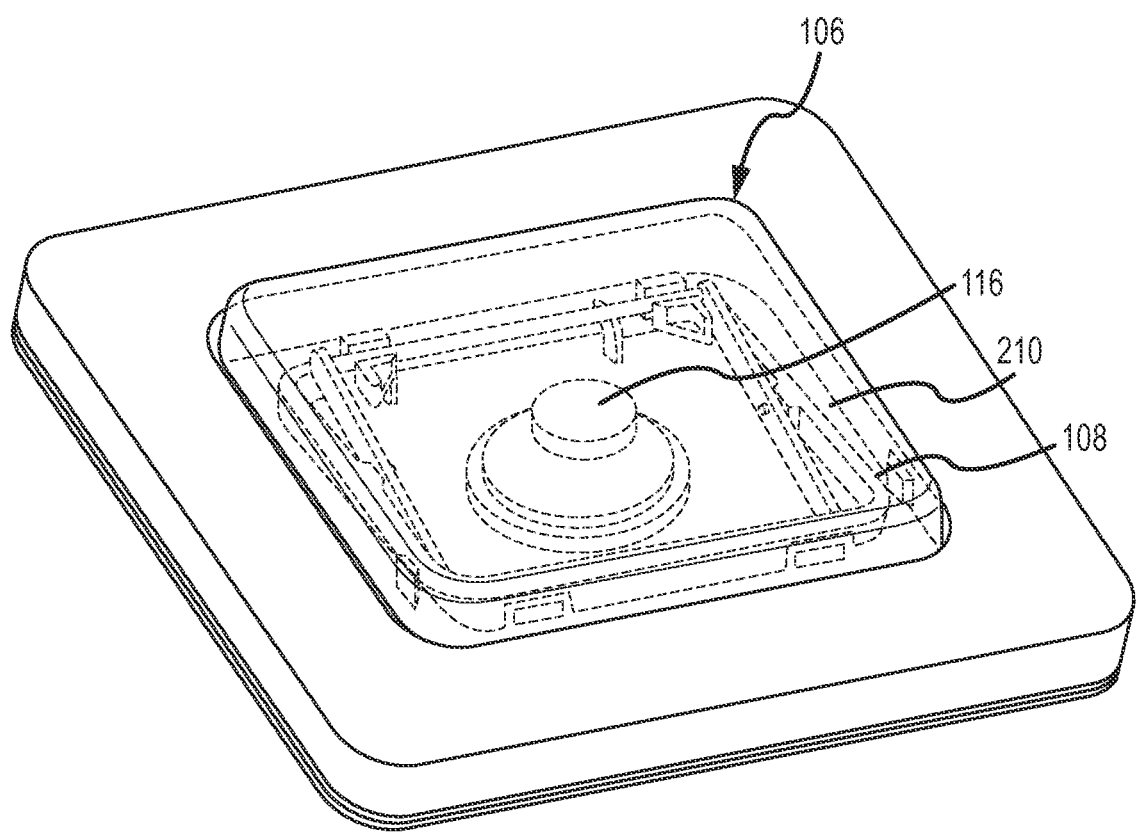
FIG. 6A is a perspective view of the key in a normal or resting position.
Figure 6B:
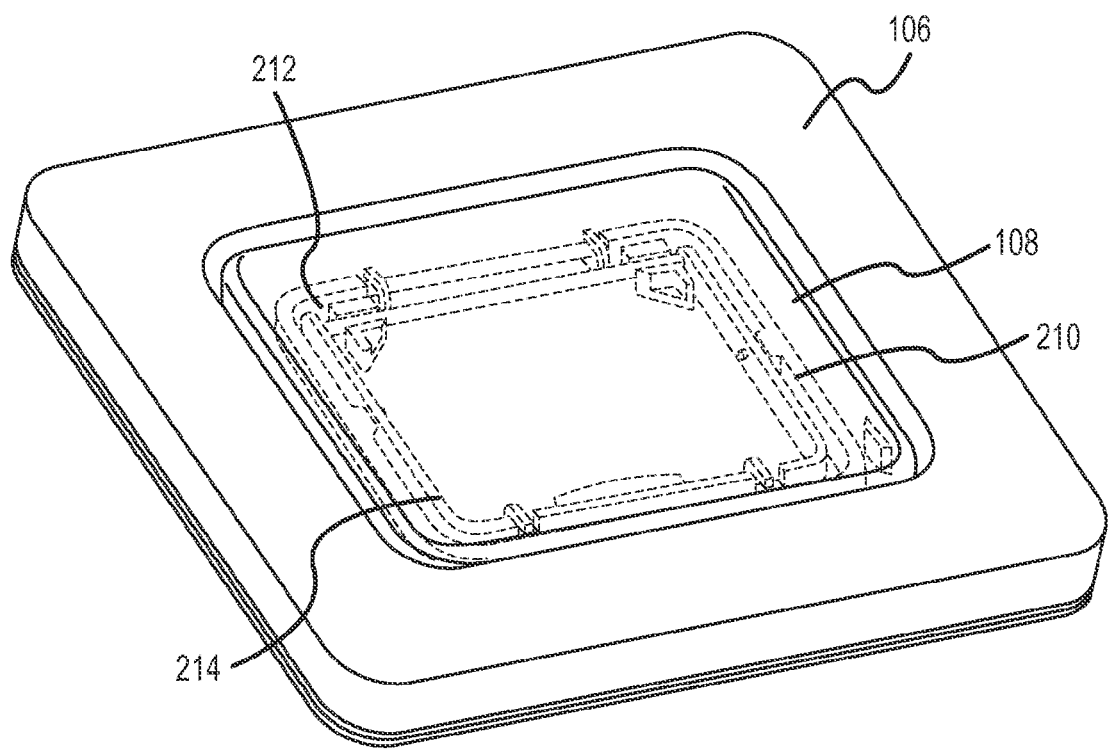
FIG. 6B is a perspective view of the key in a depressed position.

Turning now to the motion of the key 106, as a force is applied to the keycap 108, the support mechanism 210 may allow the keycap 108 to move vertically within the key aperture 128. FIG. 6A is a perspective view of the key 106 in a normal or resting position. FIG. 6B is a perspective view of the key 106 in a depressed position. As the keycap 108 is depressed, the keycap 108 travels vertically and the height of the support structure 210 decreases.

With reference now to FIGS. 4B and 5, when the key 106 is in a resting position, a bottom edge 248 of the keycap 108 may be positioned at a height H1 from a top surface of the base 134. The first support 212 may be angled upward from a first side of the key 106 to a second side of the key 106, as the brace 230 is connected to keycap 108 (positioned above the feature plate) and the cross member 222 is operably connected to the feature plate 118. Similarly, the second support 214 may be angled upward from a second side of the key 106 to the first side of the key 106. This is because the cross member 222 of the second support 214 is operably connected to the keycap 108 and the brace 230 is operably connected to the feature plate 118.

In some embodiments and as shown on FIG. 4B, the corners 226, 236 of each of the supports 212, 214 may be positioned adjacent an inner corner edge of the keycap 108. As compared with the conventional keyboard keys, these corners 226, 236 may be substantially further away from a center of the keycap 108 and thus may better prevent tilt of the keycap 108. For example, if a user presses on the corner of the keycap 108, the support provided by the supports 212, 214 may prevent the corner portion of the keycap 108 from tilting. This may therefore allow the keycap 108 to have generally more planar travel motion as compared with conventional keyboards, which as described above, can help in reducing the height of the key stack 130.

In the normal position of the key 106, the two side members 232, 234 of the first support 212 may cross or otherwise form an "X" intersection with the respective parallel side members of the brace 224. This is because the two supports 212, 214 are both connected to the keycap 108 at opposite sides and connected to the feature plate 118 at opposite sides of the key 106, and angle upward from the feature plate 118 to connect to the bottom of the keycap 108 opposite of the attachment to the feature plate 118.

As a force is applied to the keycap 108, the supports 212, 214 pivot to allow vertical movement of the keycap 108 downward towards the feature plate 118. However, as the supports 212, 214 are connected to the feature plate 118, lateral movement of the supports 212, 214 may be substantially reduced. Accordingly, as the user applies a force to the keycap 108, the keycap 108 may translate substantially parallel to the feature plate 118, which in turn, causes supports to collapse and the keycap to lower. As the keycap 108 is depressed, the haptic device 116 may compress to provide feedback and/or provide a signal that the key 106 has been selected.

With reference to FIGS. 4B and 5, in this embodiment of the key 106, a light source 140 may be positioned within the key aperture 128 underneath and aligned with a portion of the keycap 108. The light source 140 may be used in conjunction with or separate from the illumination panel 120. For example, as shown in FIG. 4B, the light source 140 may be operably connected to an intermediate layer 141 which may provide power and/or signals to the light source 140. The light source 140 may provide illumination for the key 106 and will be discussed in more detail below with respect to FIG. 14.

Figure 7A:
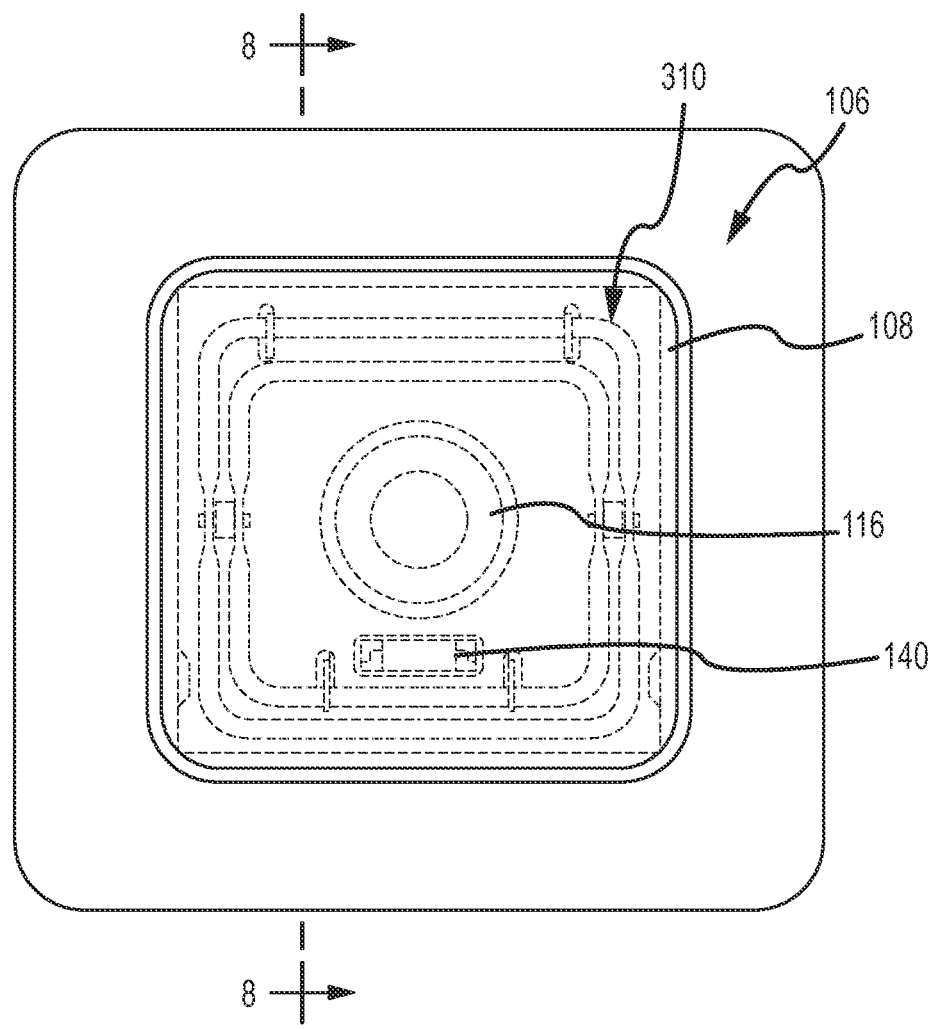
FIG. 7A is a top plan view of the key having a second embodiment of the support mechanism.
Figure 7B:
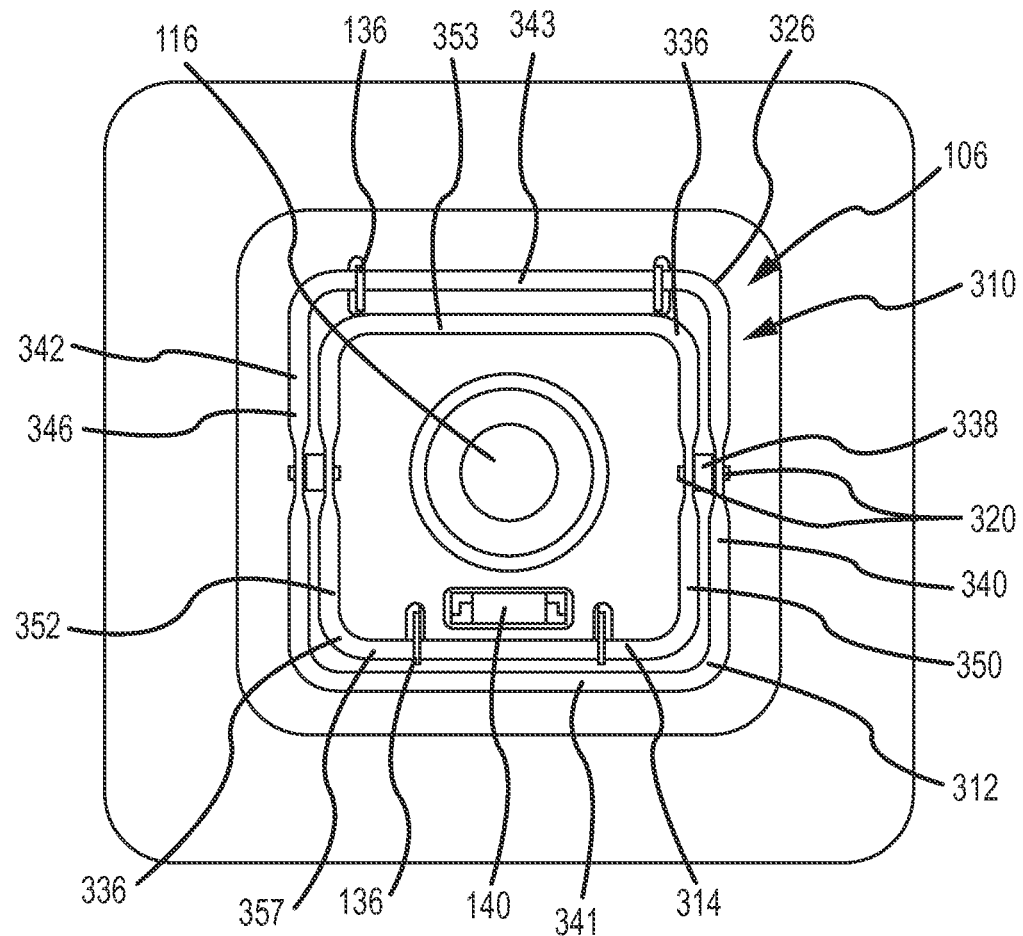
FIG. 7B is a top plan view the key of FIG. 7A with the keycap removed to illustrate certain features.
Figure 8:
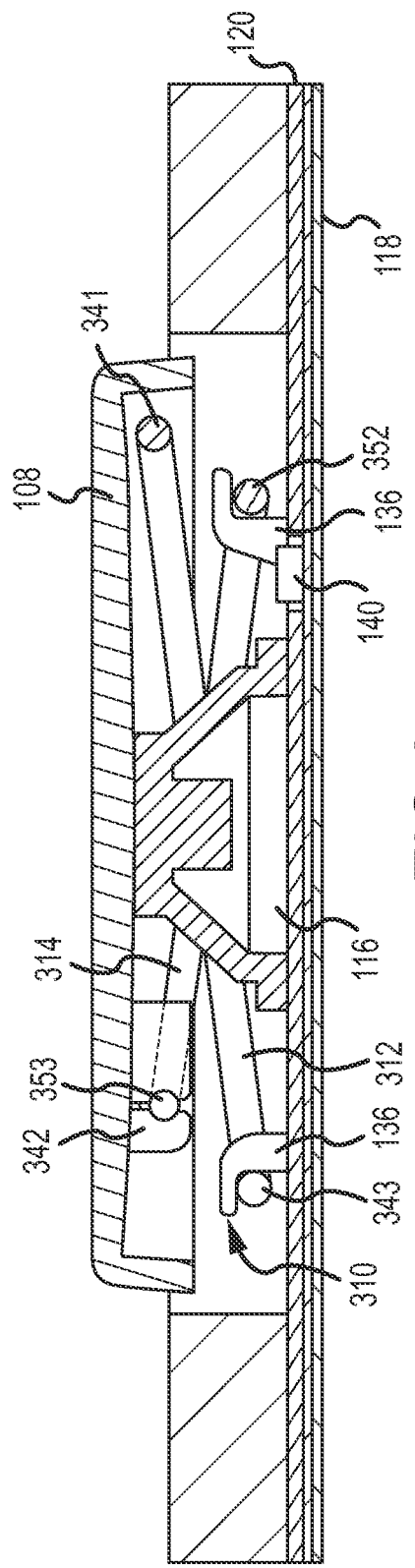
FIG. 8 is a cross-section view of the key taken along line 8-8 in FIG. 7A.

A second embodiment of the support structure 310 will now be discussed. FIG. 7A is a top plan view of the key 106 including the support structure 310. FIG. 7B is a top plan view of the key 106 with the keycap 108 removed for clarity. FIG. 8 is a cross-section view of the key 106 of FIG. 7A taken along line 8-8 in FIG. 7A. In this embodiment, the support structure 310 may include a first support 312 and a second support 314 nested within the first support 312. The supports 312, 314 may have substantially the same shape, except that the second support 314 may have smaller dimensions than the first support 312.

The first support 312 may have a generally rectangular perimeter and include rounded corners 326. In this embodiment, substantially the entire first support 312 may have a generally rounded or circular cross-section area. The first support 312 may have four side members 340, 341, 342, 343, where a first side member 340 is substantially parallel to a third side member 342 and a second side member 341 is substantially parallel to a fourth side member 343. The fourth side member 343 may be operably connected to the feature plate 118 by the anchoring members 136.

Figure 7C:
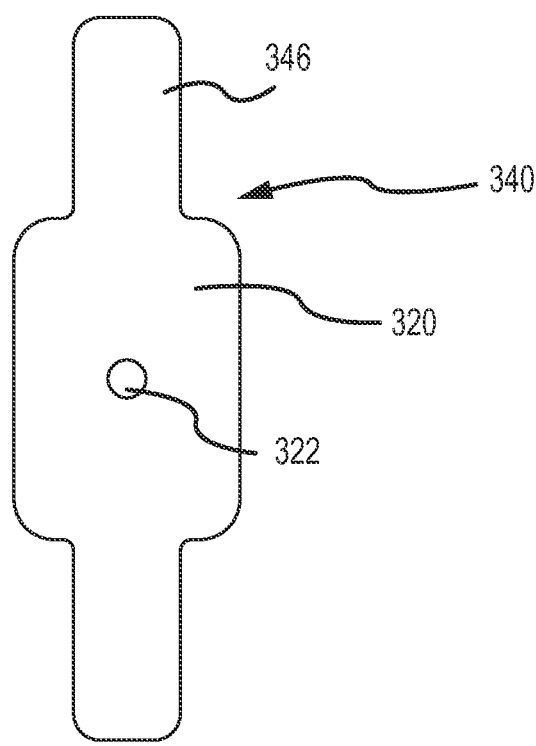
FIG. 7C is a fragmentary view of the first side member of the support mechanism.

The first side member 340 and the second side member 342 may be operably connected to the second support 314, allowing the first and second supports 312, 314 to move together. FIG. 7C is a fragmentary view of the first side member 340. The second side member 342 may be substantially the same as the first side member 340. As shown in FIG. 7C, a body 346 of the side members 340, 342 may flatten from a generally rounded cross section to form a joint 320. The joint 320 may have a non-rounded cross section, and may define a knuckle aperture 322 defined therethrough.

With reference to FIGS. 7B-7C, the second support 314 may be substantially the same as the first support 312. For example, the second support 314 may have four side members 350, 351, 352, 353 interconnected together forming a generally rectangular or square perimeter. Additionally, the second support 314 may have generally rounded corners 336 at the transition between side members 350, 351, 352, 353. Similarly to the first support 312, the second support 314 may include a joint 320 for connecting to a knuckle 338. Although FIG. 7C illustrates the first support 312, the second support 314 may be substantially the same. Accordingly, the joint 320 may further define a knuckle receiving aperture 322 within the flattened portion. Furthermore, the second support 314 may have a generally rounded or cross-section area, except at the joint 320 where the cross-section area may be flatten and more linear.

With reference to FIG. 7B, two knuckles 328 may be positioned between the first support 312 and the second support 314. The knuckles 328 may act to space the two supports 312, 314 apart from each other, while also connecting them together. Further, the knuckles 328 act as pivot joints to allow the supports 312, 314 to move with respect to each other. The knuckles 328 may be received within the knuckle apertures 322 in each of the joints 320. At the connection of the knuckles 328, the supports 312, 314 may extend in opposite directions away from each other. For example, similar to the locking members 228, the knuckles 328 may form the middle point of an "X", where the two supports 312, 314 form an angle with respect to the knuckles 328. As the supports 312, 314 move in response to a force on the keycap 108, the angle formed between the two supports 312, 314 may decrease, lowering the keycap 108 towards the feature plate 118.

In the embodiment illustrated in FIG. 7B, the knuckles 328 may form two pivot points for the support mechanism 310. Thus, the supports 312, 314 may be substantially anchored to the feature plate 118, e.g., by the anchoring members 136 operably connected to the side members 343, 351, respectively.

Figure 9A:
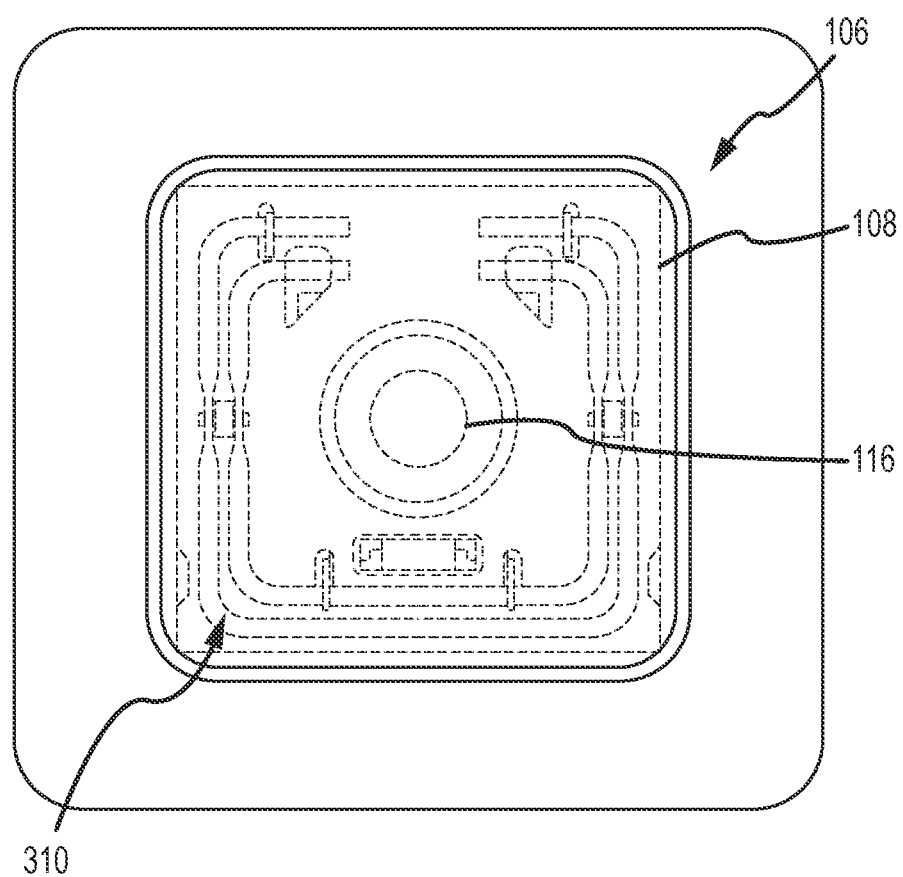
FIG. 9A is a top plan view of the key having a third embodiment of the support mechanism.
Figure 9B:
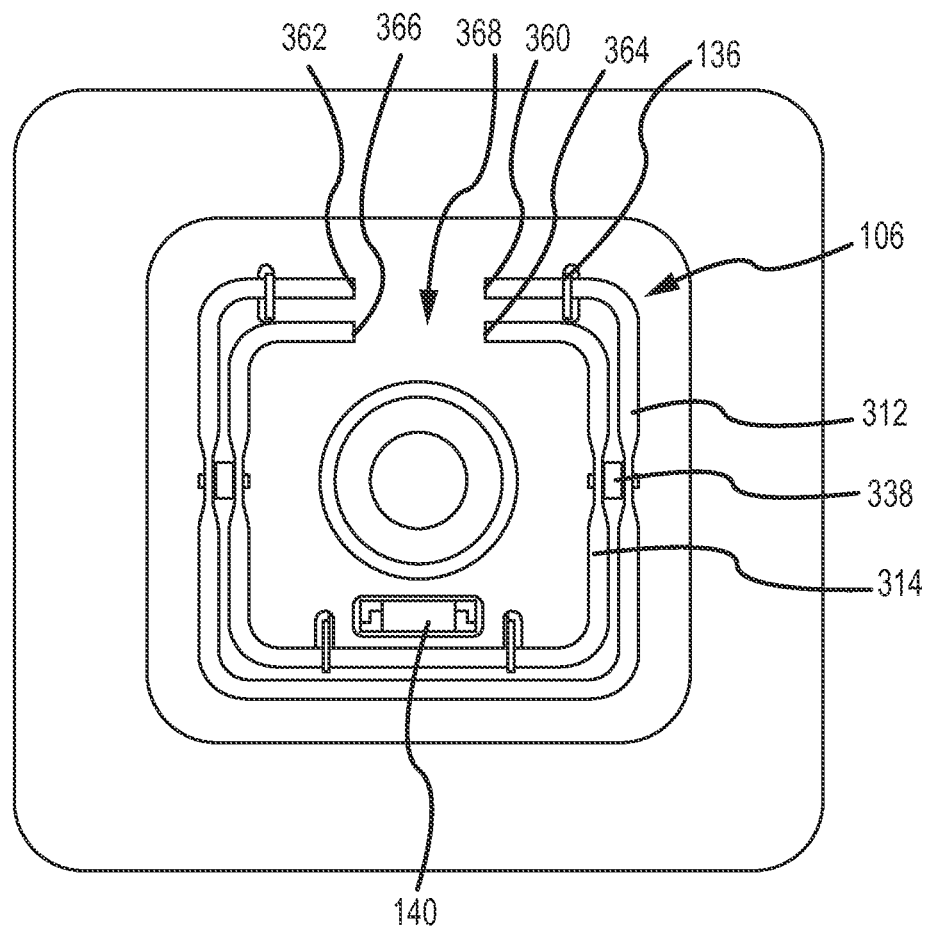
FIG. 9B is a top plan view of the key of FIG. 9A with the keycap removed to illustrate certain features.

In some embodiments, the supports 312, 314 may form "open loops," in that the support members 312, 314 may define a space between opposite ends of the each support 312, 314. FIG. 9A is a top plan view of the key 106 including the support mechanism 310. FIG. 9B is a top plan view of the key 106 of FIG. 9A with the keycap removed 108. The fourth side member 343 of the first support member 312 may terminate in two opposing edges 360, 362. Similarly, the fourth side member 353 of the second support 314 may terminate in two opposing edges 364, 366. The two sets of edges 360, 362, 364, 366 may define a space 368 between each end of the side members 343, 353, respectively.

In the embodiment illustrated in FIGS. 9A and 9B, the supports 312, 314 may form the open loops, which may require less material to form the support mechanism 310. Furthermore, the open loop configuration may increase the ease of assembly and manufacturing of the keyboard 102. With the open loop configuration, the supports 312, 314 may be more easily positioned within the anchoring members 136 and connected to the securing features 142 of the keycap 108. Furthermore, by defining a space 368, more light may be transmitted from the illumination panel 120 or other light source to the keycap 108 and/or space surrounding the keycap 108 in order to illuminate the key 106 and the perimeter of the key 106.

Figure 10A:
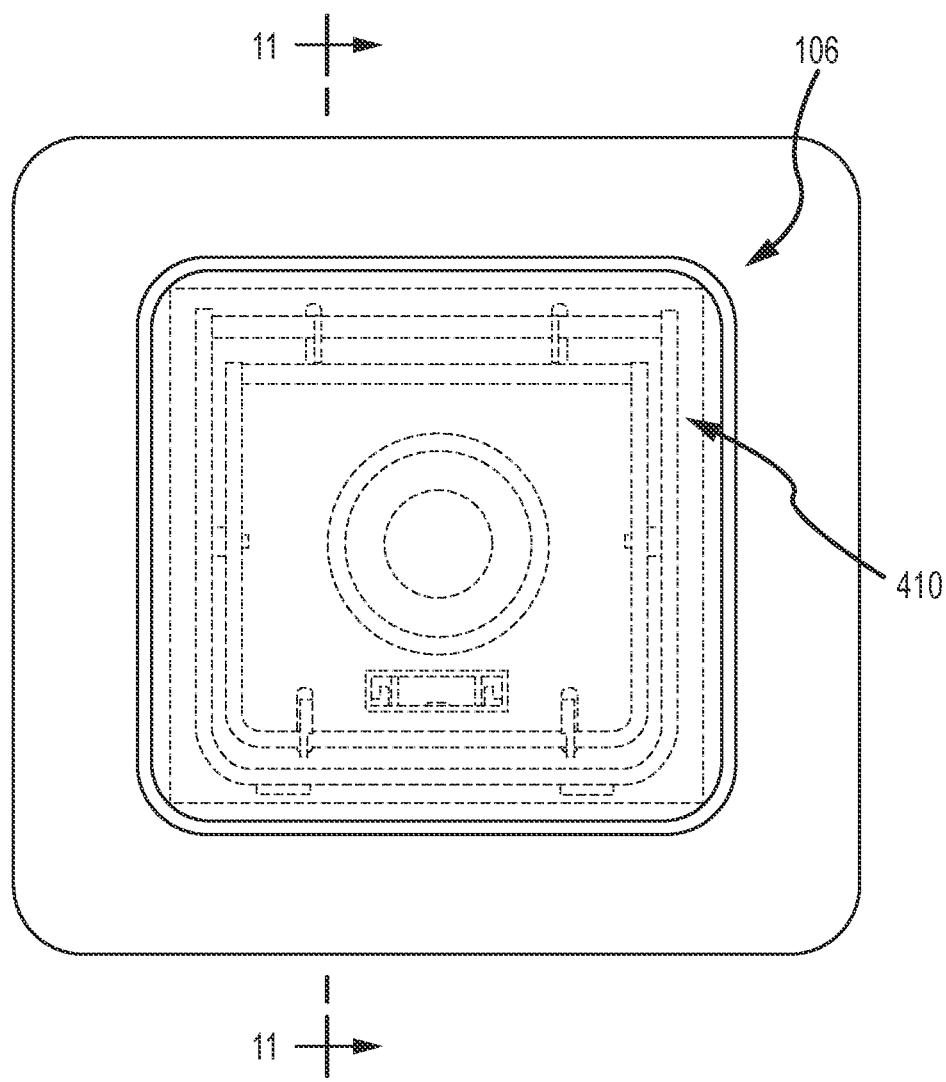
FIG. 10A is a top plan view of the key having a third embodiment of the support mechanism.
Figure 10B:
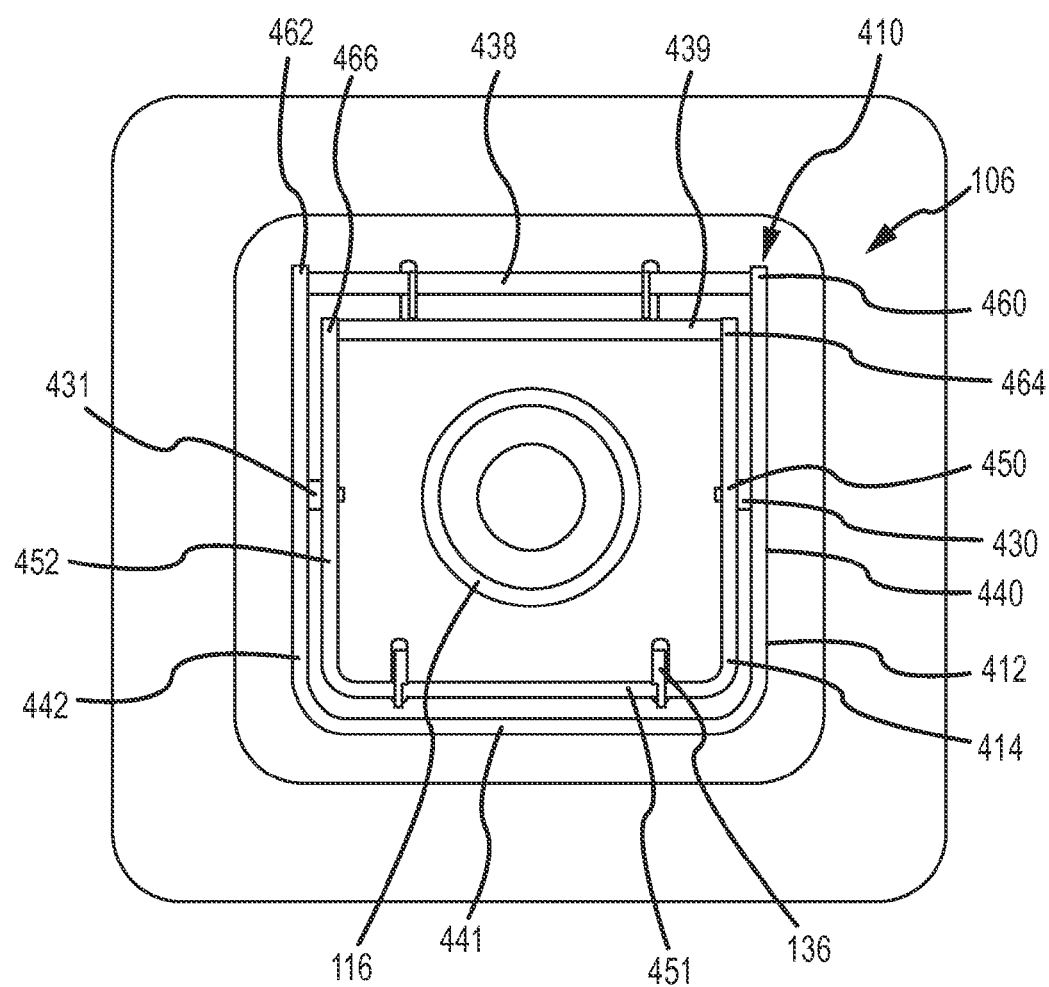
FIG. 10B is a top plan view of the key of FIG. 10A with the keycap removed to illustrate certain features.

In another embodiment, the support structure may include a separate joint member interconnecting opposing edges of the supports. FIG. 10A is a top plan view of the key 106 having a support structure 410 with a joint member 438 spanning between the edges of each of the supports 412, 414. FIG. 10B is a top plan view of the key 106 of FIG. 10A with the keycap 108 removed. FIG. 11 is a cross-section view of the key 106 of FIG. 10A taken along line 11-11 in FIG. 10A. The support mechanism 410 may include supports 412, 414 for supporting the keycap 108 above the base 134, and connecting the keycap 108 to the base 134.

The supports 412, 144 may be substantially the same shape, with the second support 414 at least partially nested within but spaced apart from the first support 412. As shown best in FIG. 10B, the supports 412, 414 may be substantially "U" shaped, except that the supports 412, 414 may have a substantially straight bottom. Each support 412, 414 may include two parallel side members 440, 442, 450, 452 and a bottom member 441, 451 spanning between the two parallel side members 440, 442, 450, 452. The side members 440, 442 of the first support 412 may include terminal edges 460, 462. Similarly, the side members 450, 452 of the second support 414 may include terminal edges 464, 466. Additionally, the supports 412, 414 may have a non-rounded cross section (e.g., I beam, rectangular, or square-shaped) so as to provide additional stiffness for the support structure 410 in bending and torsion.

A first joint member 438 may span between the terminal edges 460, 462 of the first support 412. A second joint member 439 may span between the terminal edges 464, 466 of the second support 414. In one embodiment, the joint members 438, 439 may have a generally rounded or circular cross-section, and thus may provide a pin joint for each of the supports 412, 414. Furthermore, the first joint member 438 may be operably connected to the feature plate 118 by the anchoring mechanism 136. For example, as shown in FIG. 11, the first joint member 438 may be received within a cavity defined by the "hook" or L shape of the anchoring member 136. The second joint member 439 may be operably connected to the retaining feature 143 of the keycap 108. The joint members 338, 439 allow the support members 412, 414 to rotate about one axis, while preventing motion in the other two. In other words, the supports 412, 414 may rotate around a Y axis as the keycap 108 translates vertically, while the supports 412, 414 remain substantially secured along the X and Z axis (laterally, and vertically).

With reference to FIG. 10B, the supports 412, 414 may be operably connected together by a pair of pins 430, 431. A first pin 430 operably connects the first side members 440, 450 and a second pin 431 operably connects the second side members 442, 452 together. The pins 403, 431 provide a pin joint to allow the supports 412, 414 to be connected together and rotate with respect to each other. The pins 430, 431 may be similar to the knuckles 328 in FIG. 7B, in that they may from a middle point of an X, formed by the side members of the supports 412, 414.

As shown in FIG. 10B, the joint members 438, 439 having the rounded cross-sections may be positioned on the same side of the keycap 108. In these embodiments, the supports 412, 414 may be rotatably supported to the keycap 108 and the feature plate 118 on a single side of the keycap 108. This configuration may allow for better vertical movement for the keycap 108, while substantially preventing lateral motion of the keycap 108.

Illumination

With reference again to FIG. 3, in some embodiments, the keyboard 102 may include one or more illumination mechanisms to illuminate the keys 106 or keyboard 100. For example, the illumination mechanism may provide light to illuminate a symbol on the keycap 108 and/or may illuminate a perimeter of the key cap 108. The illumination may allow the keys 106 to be better viewable in low lighting conditions, and may also provide an aesthetic appeal to the keyboard 102. Furthermore, the illumination mechanisms may provide feedback to the user, may create lighted patterns on the keyboard 102, and so on.

Typical keyboards having an illumination mechanism may position the mechanism below a feature plate. This is because the feature plate is typically used to secure the elements of the key to the enclosure, as well as provide electrical connections for the keys. Typically, illumination mechanisms may not provide for electrical components or attachment mechanisms for the key, and so the illumination mechanisms are positioned below the feature plate. However, this positioning may cause light from the illumination mechanism to be at least partially blocked by the feature plate, or may cause the light to travel in a non-direct manner towards the keycap 108.

Figure 12A:
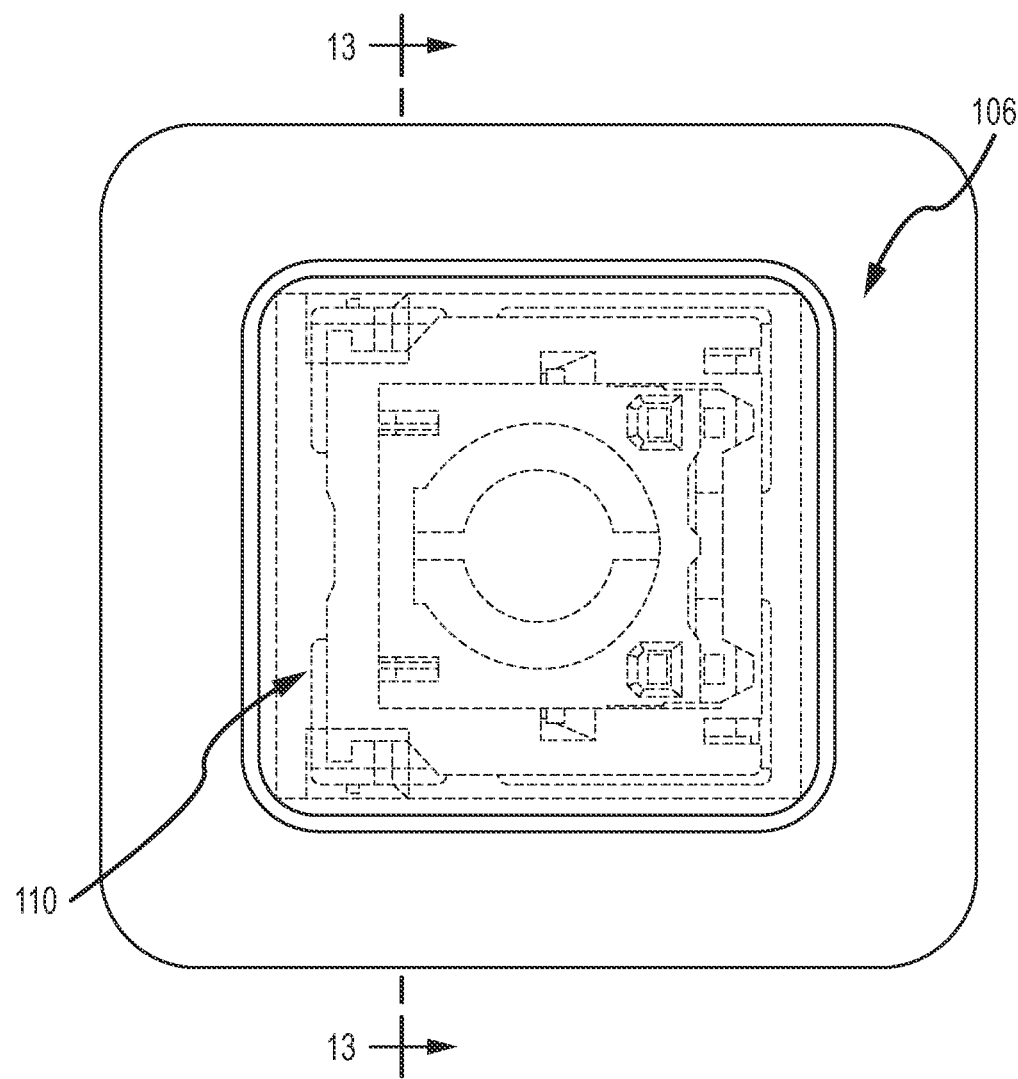
FIG. 12A is a top plan view of the key having an illumination panel and a feature plate.
Figure 12B:
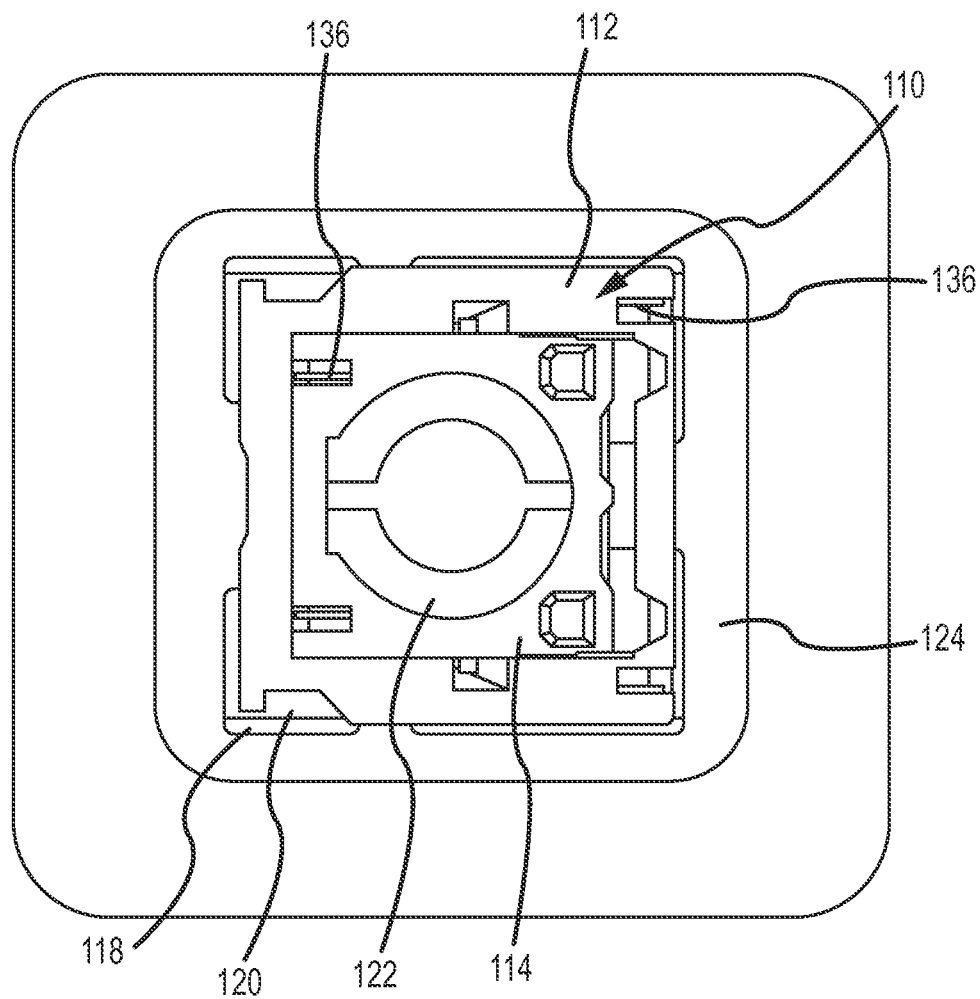
FIG. 12B is a top plan view of the key of FIG. 12A with the keycap removed to illustrate certain features.
Figure 12C:
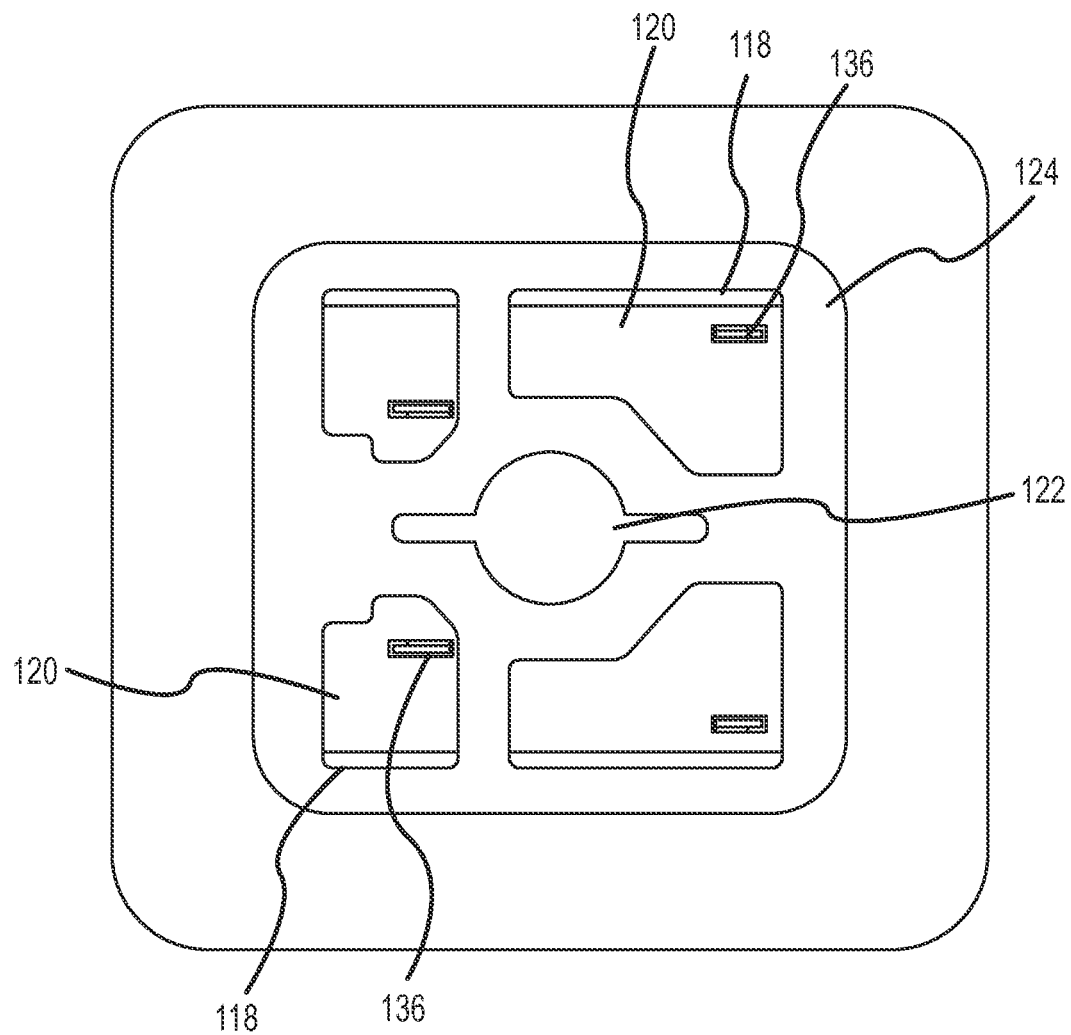
FIG. 12C is a top plan view of the key of FIG. 12A with the keycap and the support mechanism removed to illustrate certain features.

In some embodiments, the keyboard 102 may include an illumination panel 120 positioned on top of the feature plate 118. FIG. 12A is a top plan view if the key 106 having the illumination panel 120 positioned above the feature plate 118. FIG. 12B is a top plan view of the key 106 with the keycap 108 removed. FIG. 12C is a top plan view of the key 106 with the support mechanism 110 removed to illustrate certain elements clearly. FIG. 13 is a cross-section view of the key 106 of FIG. 12A take along line 13-13 in FIG. 12A. In this embodiment, the illumination panel 120 may be operably connected to a top surface 612 of the feature plate 118. The feature plate 118 and the illumination panel 120 may be operably connected the sensor membrane 122, which may be positioned on over at least a portion of one or both the illumination panel 120 and the feature plate 118. As described above, with respect to FIG. 3, the sensor membrane 122 may be operably connected to the enclosure 104 by adhesive 124 and/or a fastener 126.

FIG. 14 is a perspective view of the feature plate 118 and the illumination panel 120 removed from the keyboard 102. The feature plate 118 and illumination panel 120, as shown in FIG. 14, are illustrated having a length for supporting three keys 106 and corresponding key stacks 130. Accordingly, the length of the feature plate 118 and the illumination plane 120 may be varied for fewer or more keys 106. In some embodiments, there may be a single feature plate 118 and/or illuminator panel 120 for each row of keys 106, each key 106, or for the entire keyboard 102.

With reference to FIGS. 13 and 14, the feature plate 118 may have a base member 604 having two angled extensions 606 that extend upwardly at an angle from the base member 604. The two extensions 606 transition to form legs 608 or shoulders that extend substantially parallel to the base member 604. The base member 604 may be at least partially recessed from the legs 608 and may define a channel 614 configured to receive at least a portion of the illumination panel 120.

Each of the legs 608 may include one or more securing apertures 602 for securing the feature plate 118 to the enclosure 104 and/or other portions of the key stack 130. In one embodiment, there may be four securing apertures 602 spaced apart from each other on each leg 208.

The anchoring members 136 may extend upward from a top surface of the channel 614. The anchoring members 136, as described above, may be hook members that may have a "L", "J," or other shape that may allow the supports 112, 114 of the support mechanism 110 to be secured to the feature plate 118. The anchoring members 118 may have different orientations and positions on the feature plate 118 depending on the position and orientation of the supports 112, 114. However, in some embodiments, there may two anchoring members 136 for each support 112, 114; thus, there may be four anchoring members 136 for each key 106.

The illumination panel 120 may be operably connected to the feature plate 118, e.g., through adhesive, fasteners, or the like. As shown best in FIG. 14, the anchoring members 136 extend through the illumination panel 120. Accordingly, the anchoring members 136 may also assist to operably connect the illumination panel 120 to the feature plate 118. As such, in some embodiments, the anchoring members 136 may be the only connection mechanism between the illumination panel 120 and the feature plate 118.

The illumination panel 120 may be a device for directing and/or emitting light. In some embodiments, the illumination panel 120 may be a light guide, light pipe, or like. In these embodiments, one or more of the light sources 140 may be optically connected to the illumination panel 120 to provide light to be transmitted by the illumination panel 120. For example, with reference to FIG. 14, two light sources 140 are positioned on opposite ends of the illumination panel 120. The light sources 140, which may be light emitting diodes, emit light into the illumination panel 120. The light may then be transmitted through the illumination panel 120 across the length of the feature plate 118. The light may be configured to be emitted in substantially any direction; however, in some embodiments, the light may be emitted from a top surface of the illumination panel 120.

In other embodiments, the illumination panel 120 may be a light source, such as an organic light emitting diode, light emitting diode, or the like. In these embodiments, the light sources 140 may be omitted, or may provide additional light for the key 106.

The illumination panel 120 may also include one or more sensors (not shown) integrated therein for sensing inputs to the key 106. For example, the illumination panel 120 may include a capacitive sensor, a switch mechanism, or the like. These sensors will be discussed in more detail below with respect to FIGS. 19-21.

With reference to FIG. 13, the illumination panel 120 may be positioned within the channel 614 of the feature plate 118. In some embodiments, there may be a space 610 between an edge of the illumination panel 120 and the top corner of the legs 608 and the extension 606 members. In other embodiments, the edge of the illumination panel 120 may angle upwards substantially following the shape of the extension members 606 and the space 610 may be eliminated. Within the channel 614, the illumination panel 120 may be substantially parallel to and coextensive with the base 604.

The supports 112, 114 of the support mechanism 110 may be operably connected to the anchoring members 136, and in some positions the supports 112, 114 may be adjacent to or rest against a portion of the illumination panel 120. The haptic device 116 may be positioned above the illumination panel 120 and in some embodiments may be operably connected to the sensor membrane 122, which may be positioned above the illumination panel 120.

In the keyboard 102 embodiment illustrated in FIGS. 12A-14, the overall vertical height of the key stack 130 may be reduced as compared to conventional keyboards including an illumination mechanism. This is because, typically, the feature or anchoring plate is positioned above the illumination mechanism in order to best secure the key to the enclosure, as well as provide accurate communication of the input signals from the key to a processor or other component. However, as the anchoring members 136 extend through the illumination plate 120, the various components of the key 106 which may need to be secured to the feature plate 118, may be secured thereto, while still allowing most of the light from the illumination panel 120 to be directed towards the keycap 108 and/the perimeter around the keycap 108. Thus, the feature plate 118 can be attached directly beneath the illumination panel 120, without requiring additional fasteners or attachment layers, which can increase the thickness of the keyboard 102.

Furthermore, as the illumination panel 120 is positioned above the feature plate 118, the efficiency of the limitation panel 120 and/or light sources 140 may be increased. As briefly explained above, typically, the feature plate may block a significant portion of the light directed from the illumination panel and/or may cause the illumination panel to have to emit light in a non-perpendicular or direct manner (e.g., to avoid the feature plate). For example, in some keyboards, the feature plate may include a single aperture to allow light from the illumination mechanism to be directed towards the keycap. On the contrary, as the illumination panel 120 is positioned above the feature plate 118 and substantially beneath and parallel to the keycap 108. Thus, the illumination panel 120 can emit light substantially perpendicularly and normal to the surface of the illumination panel 120. This allows the illumination panel 120 to emit less light than conventional keyboards, while still creating the same illumination effects, such as brightness and color. This is due to the fact that more of the light emitted by a light source may exit without being blocked, reflected, or reflected.

In operation, for some embodiments, the light sources 140 may emit light into the illumination panel 120. The illumination panel 120 may transmit the light across the feature plate 118 and upwards perpendicularly towards the keycap 108. As the light is transmitted from the illumination panel 120 it may exit around the keycap 108 (e.g., through the space between the enclosure 104 and the keycap 108), or the light may be transmitted through the keycap 108.

As briefly mentioned above, the feature plate 118 and/or the illumination panel 120 may be configured to have a length that may extend along a length of multiple keys. In some embodiments, the length of the feature plate 118 and/or the illumination panel 120 may be configured to cover the length of an entire key 106 row. In these embodiments, there may be an illumination panel 120 and/or a feature plate 118 for every row of keys, which may be positioned along rows of the keyboard 102. In other embodiments, the illumination panel 120 may have different dimensions and/or be differently positioned within the keyboard 102, these are discussed in more detail below.

Figure 15A:
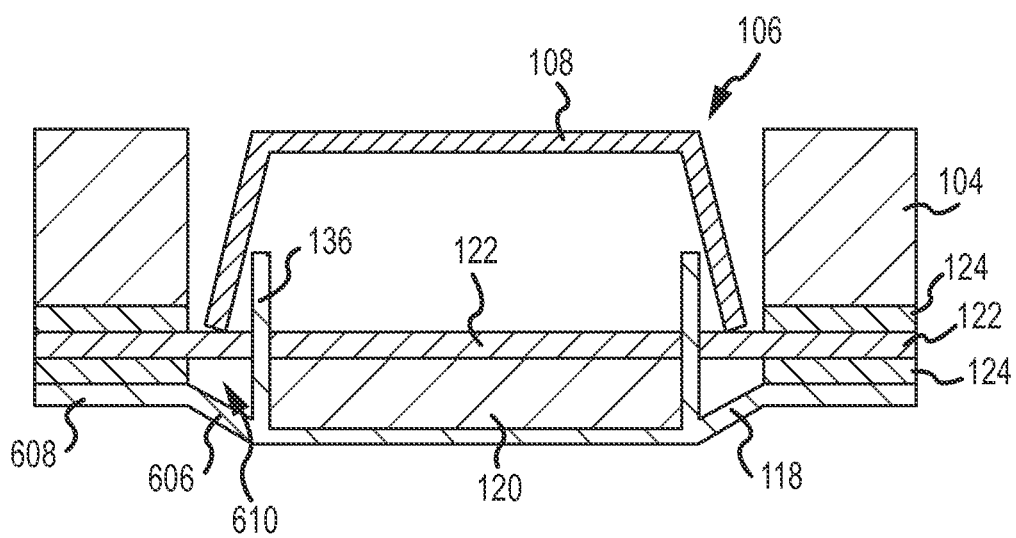
FIG. 15A is a cross-section view of a first embodiment of the key of FIG. 12A with certain features hidden for clarity.

FIG. 15A is a cross-section view of the key 102 illustrating the illumination panel 120 positioned in rows with respect to the feature plate 118 and each key 106 row. It should be noted that in FIG. 15A select features have been hidden to more clearly illustrate the relationships between other features. As shown in FIG. 15A, the anchoring members 136 may extend upwards from the base 604, and may form a barrier wall for the illumination panel 120. In this manner, the anchoring members 136 may reflect light from the illumination panel 120 back into the illumination panel or towards the keycap 108. This may concentrate the light from the illumination panel 120 under the keycap 108, so that the keycap 108 may be better illuminated and may prevent light from being emitted around the sides of the keycap 108.

As shown in FIG. 15A, the space 210 between the illumination panel 120 and the corner formed by the extension 606 and the legs 608 may be increased, as the illumination panel 120 may substantially confined within the anchoring members 136. In these embodiments, the illumination panel 120 may have a decreased width as compared to other embodiments. For example, the illumination panel 120 may span between the anchoring members 136, but may be confined within the anchoring members 136. In these embodiments, the anchoring members 136 may extend around sides of the illumination panel 120, rather than through the illumination panel 120.

In the embodiment illustrated in FIG. 15A, the legs 608 of the feature plate 118 may be operably connected to the sensor membrane 122 by the adhesive 124. The adhesive 124 may further act to operably connect the membrane 122 to the enclosure 104.

Figure 15B:
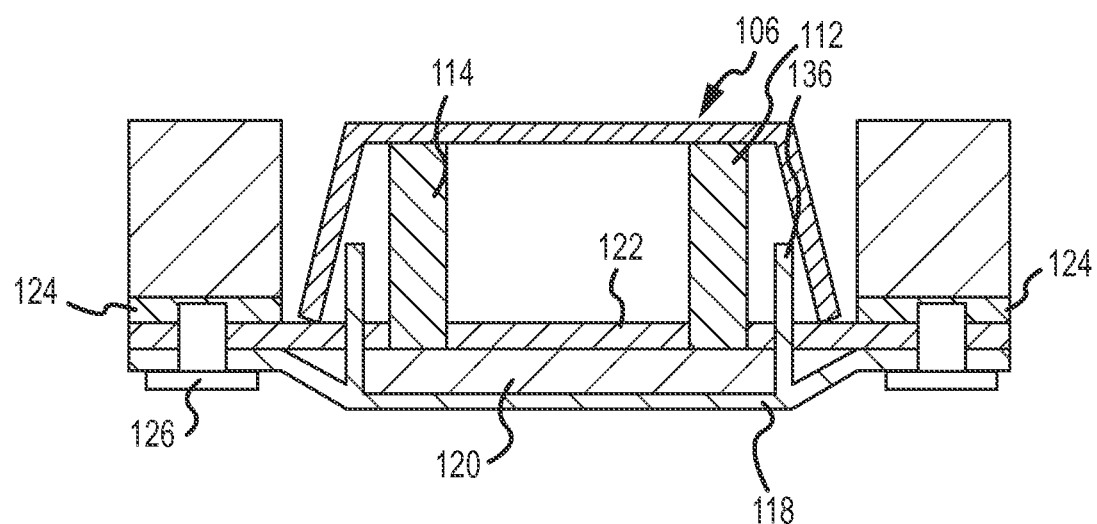
FIG. 15B is a cross-section view of a second embodiment of the key of FIG. 12A with certain features hidden for clarity.

In other embodiments, the supports 112, 114 of the support mechanism 110 may be positioned adjacent to the illumination panel 120. FIG. 15B is a cross-section view of the key 106 illustrating the supports 112, 114 extending through the sensor membrane 122 and contacting the illumination panel 120. In these embodiments, the illumination panel 120 may include sensors for detecting when the keycap 108 is pressed by a user. This may reduce the vertical height of the key stack 130 because the supports 112, 114 may still provide the same vertical extension for the keycap 108, but may be positioned lower within the key stack 130, reducing the overall vertical height of the key stack 130.

Additionally, as shown in FIG. 15B, in some instances, one or more of the adhesive 124 layers may be replaced by fasteners 126. In these embodiments the fasteners 126 may connect to the feature plate 118 and the sensor membrane 122, but may not be operably connected to the illumination panel 120. As the illumination panel 120 may be positioned in rows and may be bordered by anchoring members 136, the height of the fastener 126 may be shared with the vertical height of the illumination panel 120. In other words, because the fastener 126 may not have to extend through the thickness of the illumination panel 120, the vertical height of the fastener 126 (when coupled to the key stack 130). Thus, the key stack 130 may have a reduced vertical height as compared to conventional keyboards where the fastener may have to travel through an illumination mechanism and a feature plate in order to secure the each component together.

In some embodiments, the fasteners 126 may be positioned on two opposite sides of the key 106. For example, the fasteners 126 may extend through the sides of the enclosure 104 bordering the key 106. The fasteners 126 may be substantially any type of fastening member, such as but not limited to, rivets, nails, screws and the like. However, in some embodiments, the fasteners 126 may be thread-less or self-clenching fasteners such as rivets. In these embodiments, the fasteners 126 may be press fit into the key stack 130, or inserted with a parallel acting squeezing force. This may allow for faster assembly time as compared to conventional keyboards which may require threaded fasteners that have to be screwed into place. Furthermore, without threads, the fasteners 126 may be inserted into the key stack 130 without requiring special aperture preparation, such as chamfering and deburring. Once inserted, the fasteners 126 may be substantially flush with the bottom side of the feature plate 118, so as to further reduce the vertical height of the key stack 130 as compared to conventional keyboards.

Figure 15C:
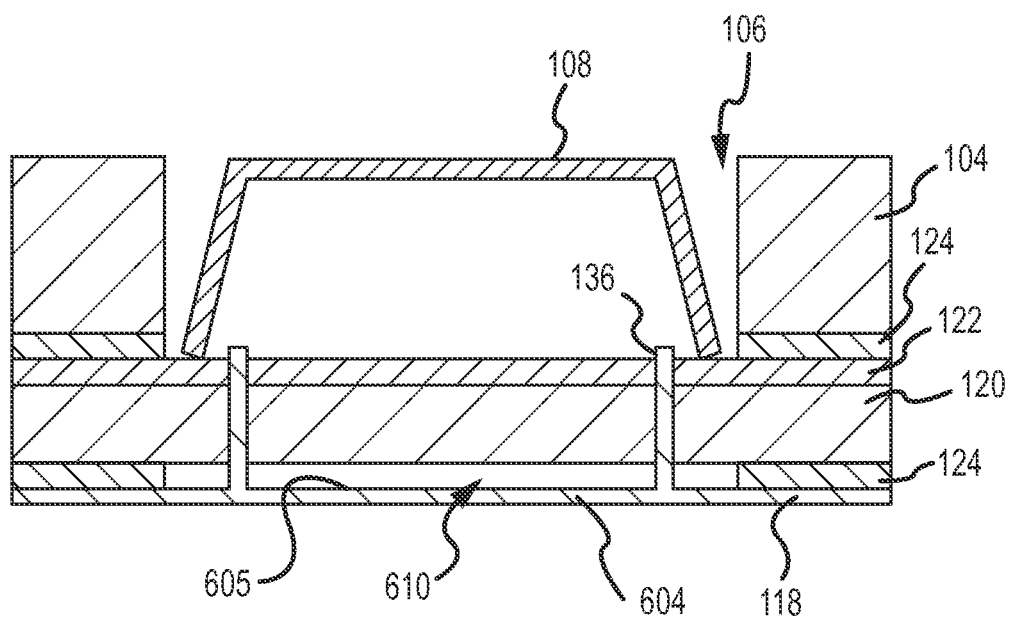
FIG. 15C is a cross-section view of a third embodiment of the key of FIG. 12A with certain features hidden for clarity.

As briefly described above, in some embodiments, the illumination panel 120 may extend past key rows or individual keys. For example, in some instances, the illumination panel 120 may extend along the entire area of the keyboard 102. In these embodiments, the illumination panel 120 may extend between keys and key rows. FIG. 15C is a cross-section view of the keyboard illustrating the illumination panel 129 extending between rows of keys 106. Additionally, as shown in FIG. 15C, in these embodiments, the feature plate 118 may also extend between rows. For example, the base 604 of the feature plate 118 may be substantially planar along multiple sets of rows, and the legs 606 may be omitted or may only extend from the terminal ends (not shown) of the feature plate 118 (at the edges of the keyboard 102).

With reference to FIG. 15C, in these embodiments, the illumination panel 120 may be positioned above the feature plate 118. For example, the lower layer of adhesive 124 may operably connect the illumination plane 120 above a top surface 605 of the feature plate 118. However, as can bee seen in FIG. 15C, the anchoring members 136 may still extend through the illumination panel 120 in order to connect the support mechanism 110 (not shown) to the feature plate 119. In these embodiments, the light sources 140 may be positioned between the feature plate 118 and the illumination panel 120 and may light the illumination panel 120 from beneath. However, in other embodiments, the light sources 140 may be positioned on the sides of the illumination panel 120 (as shown in FIG. 14), or the illumination panel 120 itself may include the light source.

Figure 16A:
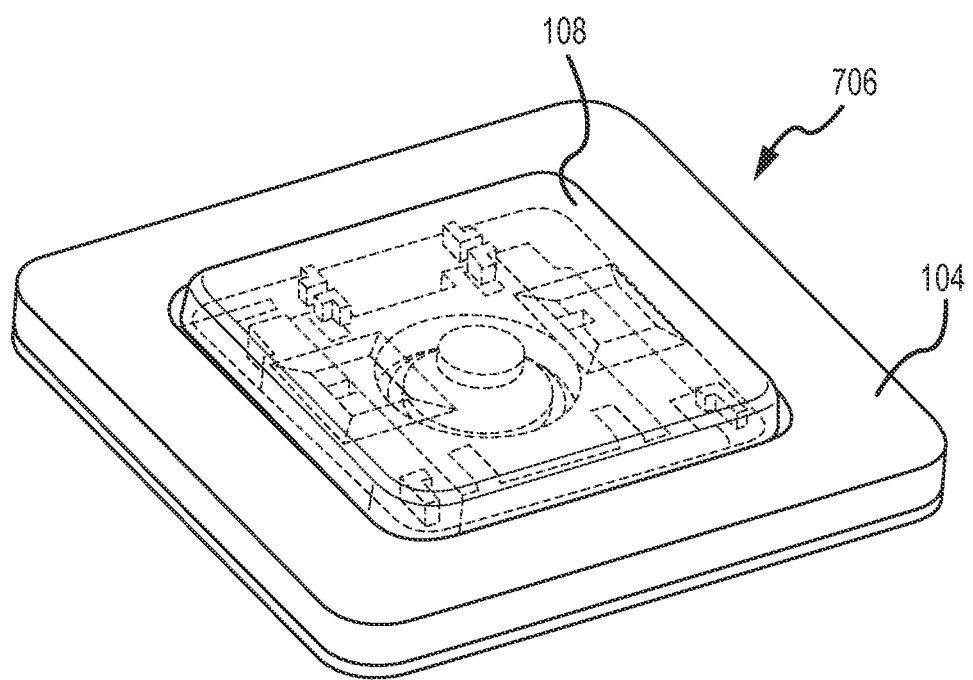
FIG. 16A is a perspective view of the key having a frame at least partially surrounding the illumination panel.
Figure 16B:
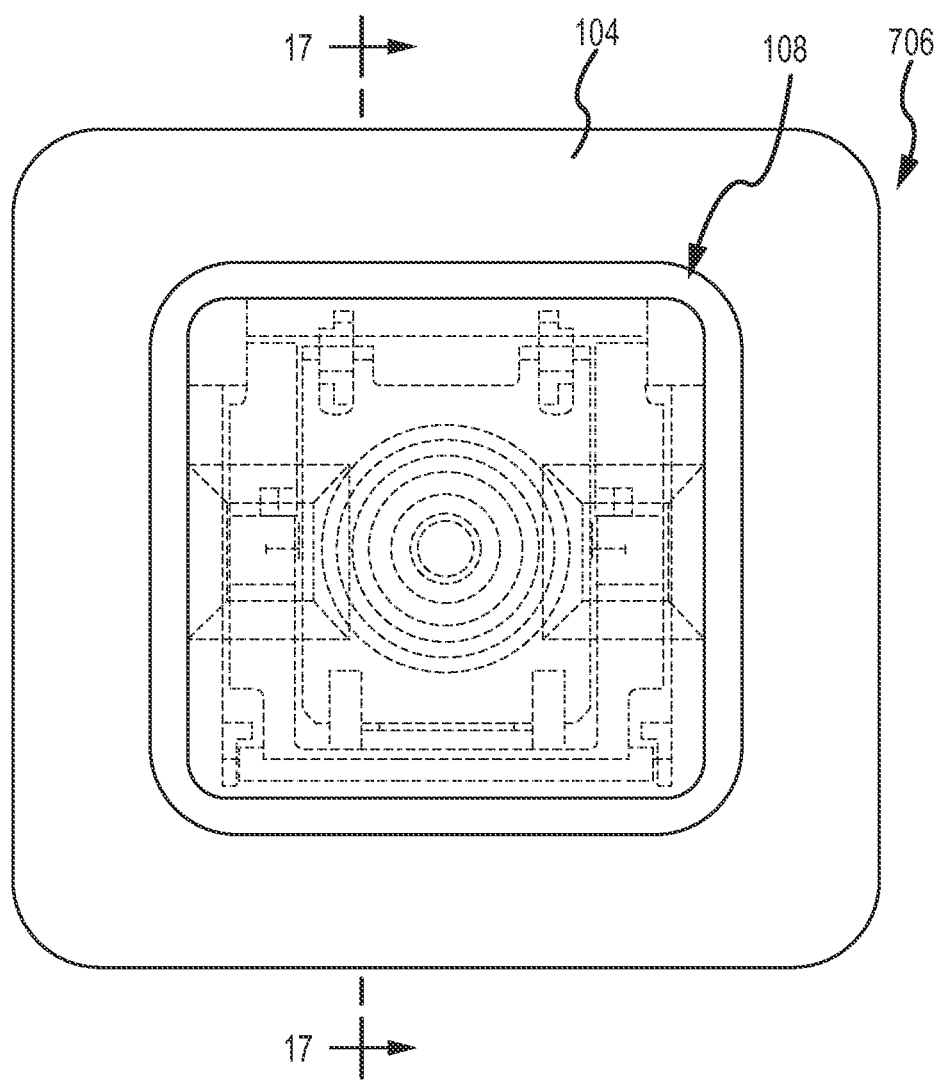
FIG. 16B is a top plan view of the key of FIG. 16A.
Figure 16C:
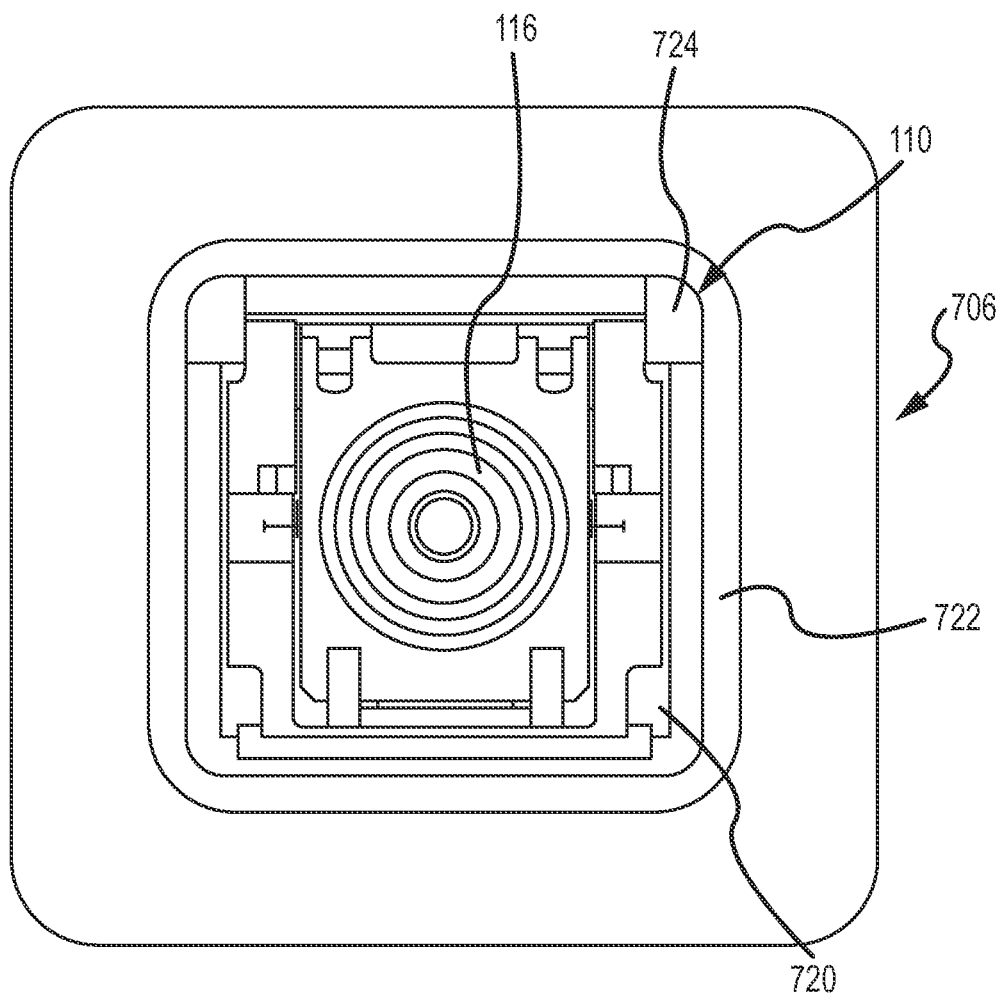
FIG. 16C is a top plan view of the key of FIG. 16A with the keycap removed to illustrate certain features.

As briefly described above, in some embodiments, the illumination panel 120 may be configured to be positioned beneath individual keys 106. FIG. 16A is a perspective view of a key 706 removed from the keyboard 102. FIG. 16B is a top plan view of the key 706. FIG. 16C is a top plan view of the key 706 with the keycap 108 removed. FIG. 17 is a cross-section view of the key 706 taken along line 17-17 in FIG. 16B. The key 706 may be substantially similar to the key 106; however, in this embodiment, the feature plate 118 may be omitted. As shown in FIG. 17, a support plate 718, which may be a printed circuit board, or the like, may be used to support the elements of the key 706. Furthermore, a frame 422 may be provided around an illumination panel 720, which may help to better contain and direct light illuminated from the illumination panel 720.

In this embodiment, the key 706 may include the support plate 718, the illumination panel 720, the light source 140, and a frame 722. The support plate 718 may form a bottom portion of the key 706, and may further communicate input signals (e.g., from a sensor indicating an user input) to components of the computing device 100. The support plate 718 may be a printed circuit board or other substrate to support electrical connections. In these embodiments, sensors and/or illumination mechanisms may be integrated with the support plate 718 to further reduce the vertical height of the key stack 130.

The illumination panel 720 may be substantially the same as the illumination panel 120. However, in these embodiments, the illumination panel 720 may be configured to have substantially the same area as the keycap 108. Accordingly, the illumination panel 720 may be better able to direct light only towards the keycap 108, so that less light may be emitted around the edges of the keycap 108 or through apertures or the like in the enclosure 104.

Figure 18:
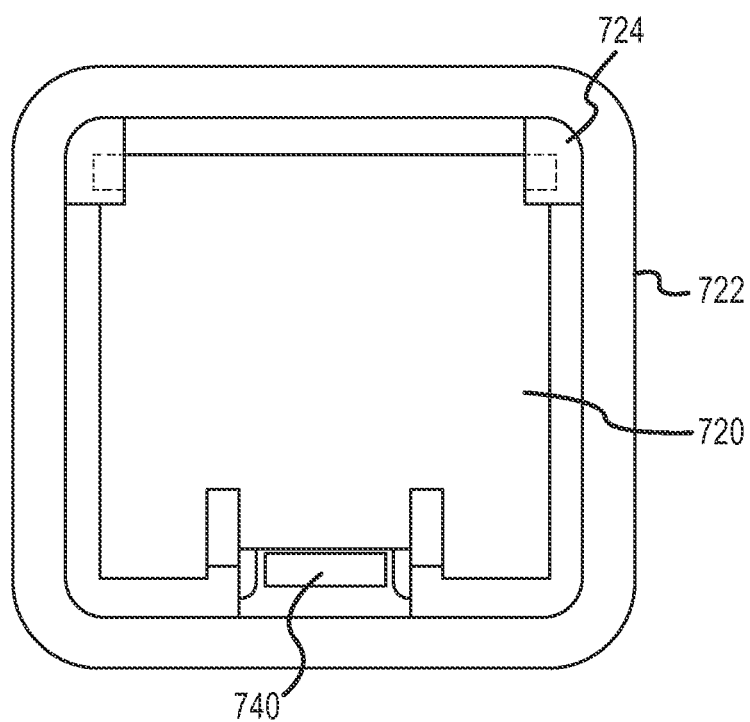
FIG. 18 is a top plan view of the frame and the illumination panel removed from the key.

The frame 722 may surround the illumination panel 720 and may assist in preventing light from being emitted in directions other than through or towards the keycap 108. FIG. 18 is a top plan view of the frame 722 positioned around the illumination 720. As can been seen in FIG. 18, the frame 722 may generally trace around the outer perimeter of the illumination panel 720 and may include one more retaining features 724 to secure the illumination panel 720 in position. In some embodiments, the frame 722 may be a material configured to substantially prevent light from being transmitted therethrough. Accordingly, the frame 722 may prevent light from being transmitted around the frame 722, and the light may reflect off the frame 722 and towards the keycap 108 or illumination panel 120.

In one embodiment, the light source 140 may be positioned along one edge of the illumination panel 720, within the frame 722. Thus, each key 706 may include its own illumination panel 720 and light source 140. In combination with the frame 722, the illumination panel 720 and the light source 140 may illuminate substantially only the keycap 108. This may prevent light leakage around the keycap 108, i.e., the "halo" effect. Accordingly, any symbols on the keycap 108 may be more easy to read, as light may not escape around the edges of the keycap 108 which may interfere with the light emitted through the keycap 108.

Sensing Member

Figure 19:
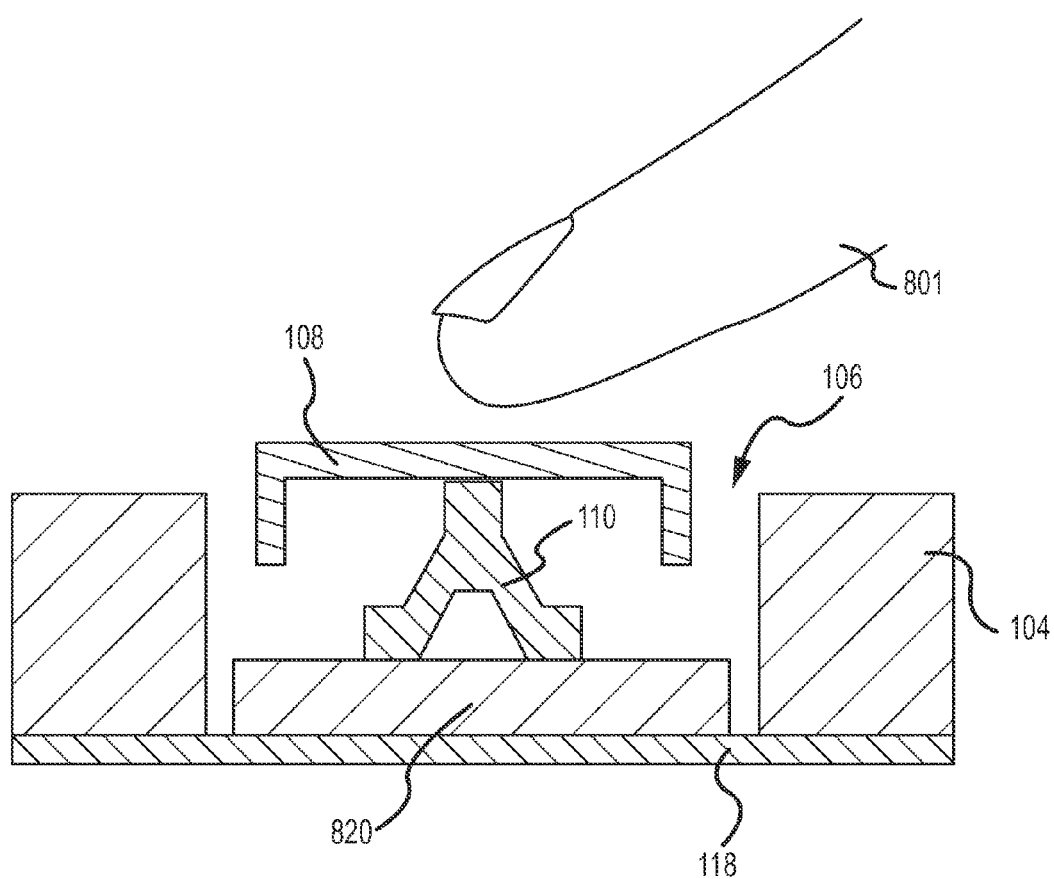
FIG. 19 is a cross-section view of the key having a sensing mechanism incorporated with an illumination mechanism, with certain features hidden for clarity.

In some embodiments, the keyboard 102 may include one or more sensors to sensor a user's input to a particular key 106 or keys. FIG. 19 is a simplified cross-section view of the key 106. The key 106 may include the keycap 108, the support mechanism 110, and the feature plate 118. Additionally, the key 106 may include a sensing member 820, which may be integrated into the illumination panel 120, or may be separate therefrom. The sensing member 820 may be a capacitive sensor, which may detect a change in capacitance. For example, the sensing member 820 may be indium tin oxide (ITO), or tin-doped indium oxide, which may be positioned on top of a light guide, light pipe, or other light source (i.e., the illumination panel 120). In one embodiment, the sensing member 820 may be ITO layered on a film of organic light emitting diodes (OLEDs). In these embodiments, the sensing member 820 may detect any of all of the following: the position of the keycap 108, a force magnitude on the keycap 108, a user's finger position on the keycap 108, and/or other parameters may be detected by the sensing member 820 via a corresponding sensor 822.

The sensing member 820 may be positioned in a number of different locations within the key stack 130, depending on the desired input to be sensed. For example, the sensing member 820 may be positioned below the keycap 108 (as shown in FIG. 19) to detect when a user has pressed the keycap 108. In other embodiments, the sensing member 820 may be positioned within the haptic device 116, which may allow the sensing member 820 to detect a compression of the haptic device 116. In yet other embodiments, the sensing member 820 may be positioned on an inner surface of the enclosure 104 or other portions of the key stack 130 facing inwards towards the key 106.

Similarly, depending on the position of the sensing member 820, the key 106 may include a shielding member to better isolate an input from the sensing member 820. For example, in some instances the sensing member 820 may detect small changes in capacitance. As the keyboard 102 may include multiple keys 106 positioned close together, with the close proximity of the keys 106, in addition to the small change in capacitance, it may be difficult for the sensing member 820 to differentiate between whether a user has a his or her finger 801 on one key or the next. Accordingly, in some embodiments, the shielding or dielectric material may isolate the sensing member 820 for external noise or other signals. In one embodiment, the sensing member 820 may be positioned between the anchoring members 136 towards the inner portion of the key 106, which may act to block the sensing member 820 from some noise. Alternatively or additionally, the sensing member 820 may be positioned within the haptic device 116, which can include one more shielding layers deposited therein to at least partially isolate the sensing member 820.

With continued reference to FIG. 19, the sensing member 820 may be integrated with the illumination panel 120 and may thus provide both sensing inputs and illumination output. In these embodiments, the vertical height of the key stack 130 may be substantially reduced. This is because the sensor membrane 122 may be omitted, and the sensing member 820 may be directly positioned below the support mechanism 110. However, in other embodiments, the sensing member 820 may be positioned in other locations.

Figure 20A:
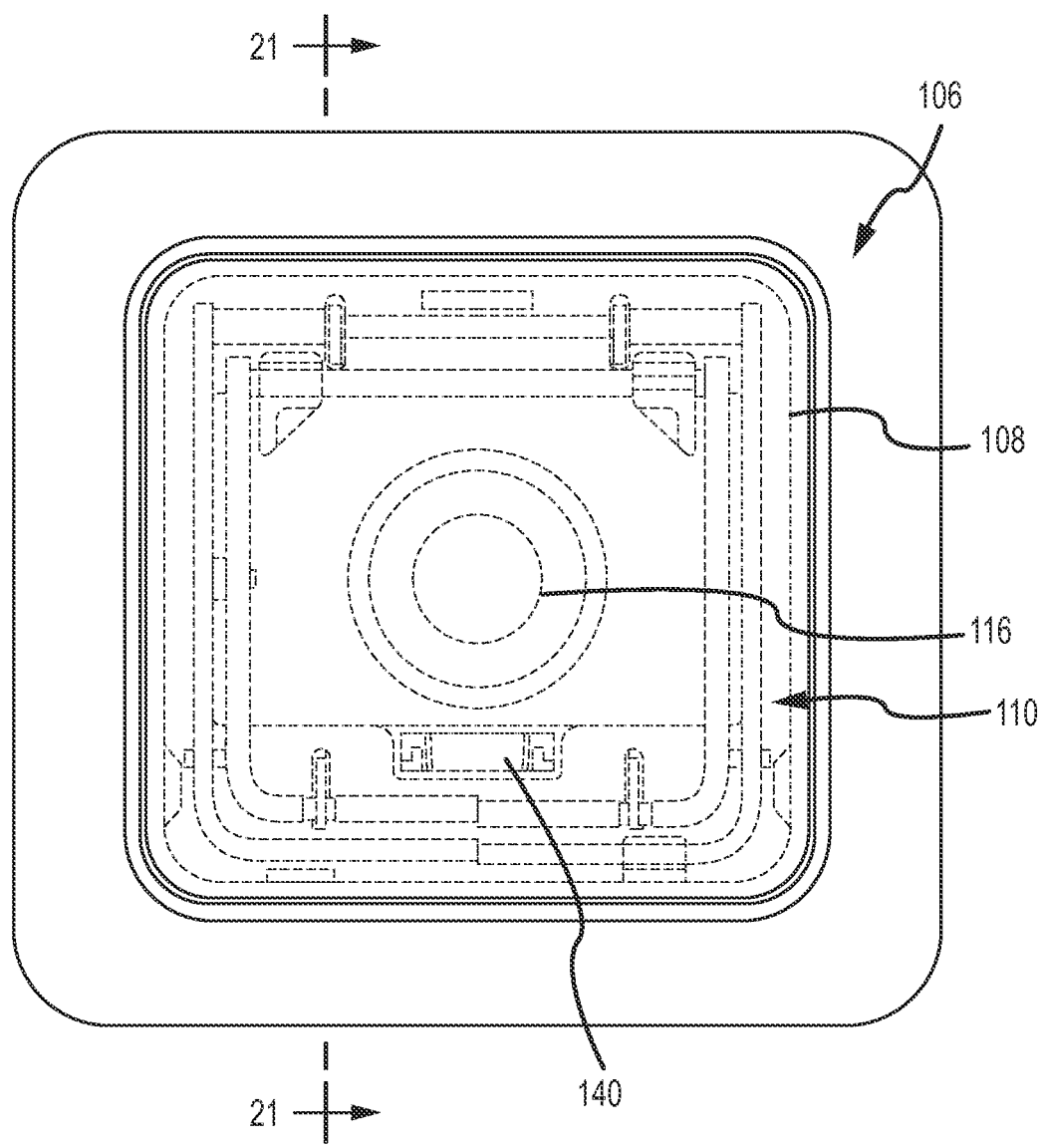
FIG. 20A is a top plan view of the key having a second embodiment of the sensing mechanism.
Figure 20B:
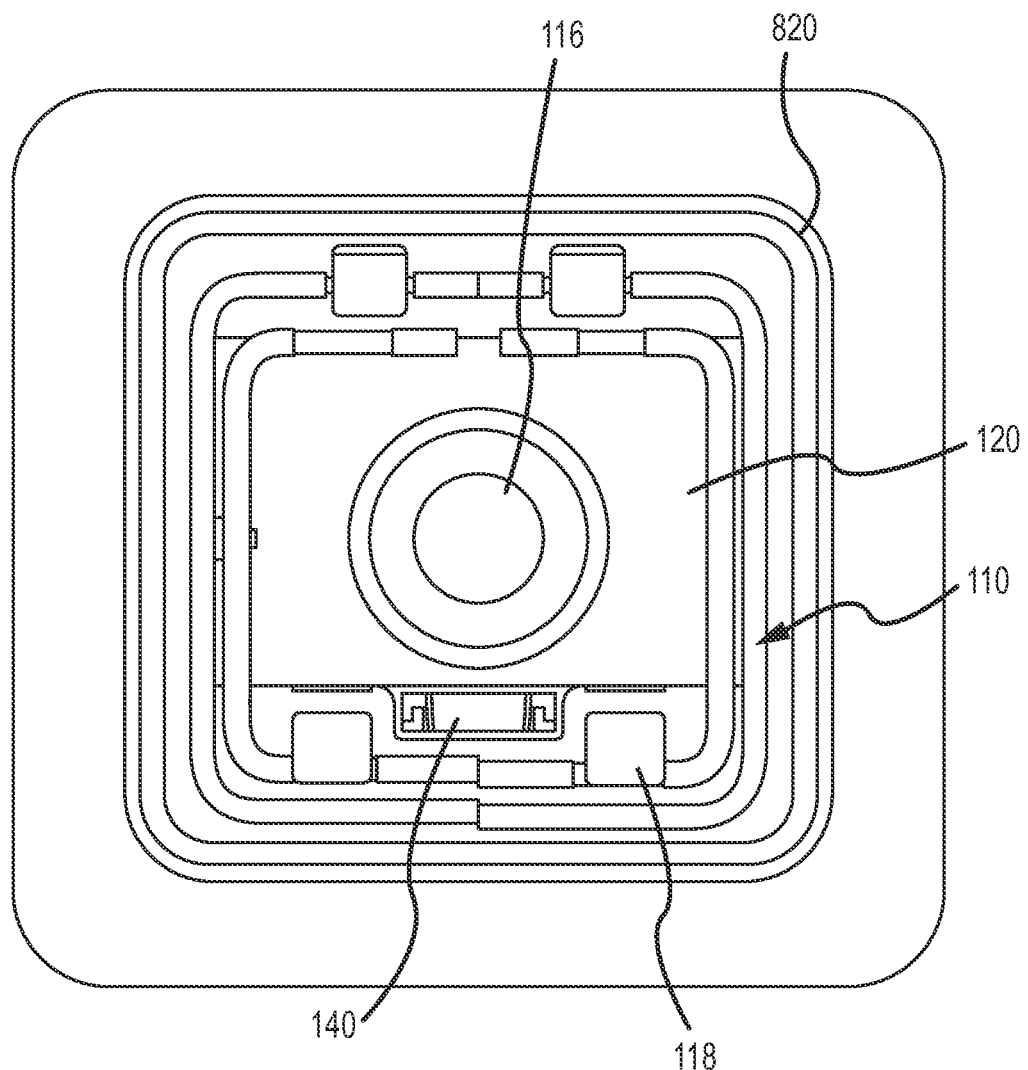
FIG. 20B is a top plan view of the key of FIG. 20A with the keycap hidden to illustrate certain features.
Figure 21:
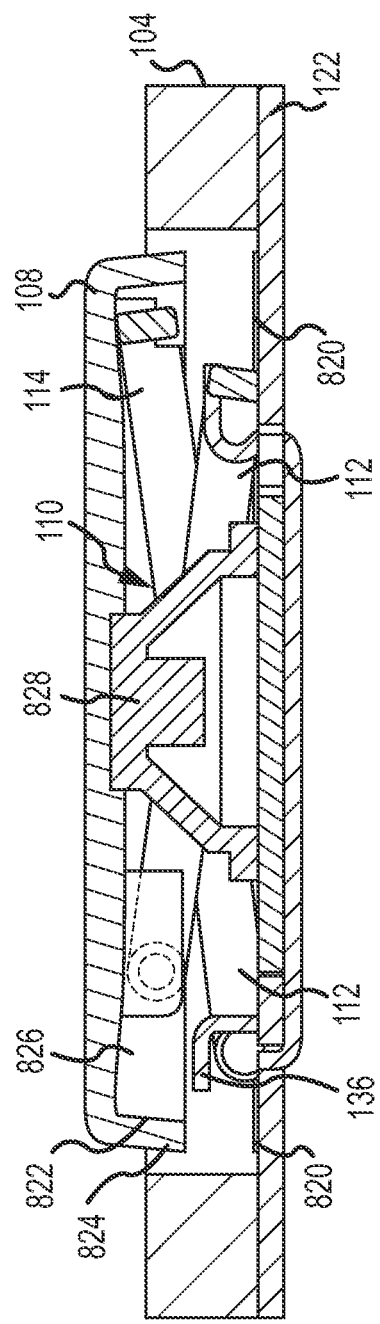
FIG. 21 is a cross-section view of the key taken along line 21-21 in FIG. 20A.

FIG. 20A is a top plan view of a key including the sensing member 820 positioned as a frame around a sensor membrane 122. FIG. 20B is a top plan view of the key 106 of FIG. 20A with the keycap removed. FIG. 21 is a cross-section view of the key 106 taken along line 21-21 in FIG. 20A. The sensing member 820 may be positioned on a top surface of the sensing membrane 122. In some embodiments, the sensing member 820 may interact with various features of the key 106, such as parts that may contain metal or the like to detect changes in capacitance or the like. In other embodiments, a corresponding sensor 822 may be positioned on a bottom edge 824 and/or a bottom surface 826 of the keycap 108. Accordingly, as the keycap 108 is pressed downward, the sensor 822 may move closer towards the sensing member 820, causing a change in capacitance for the sensing member 820. The change in capacitance allows the sensing member 820 to detect the input. In this embodiment, as show best in FIG. 20B, the sensing member 820 may be a frame positioned on the sensor membrane 122 (or other component of the base 134) so as to be substantially aligned with the bottom edge 824 of the keycap 108.

In these embodiments, the sensor 822 may be a layer of sensing material that may interact with the sensing member 822 to change a signal. For example, the combination of the sensor 820 and the sensing member 822 may have a set capacitance that varies based on the distance and/or if other capacitive elements are present.

In other embodiments, the sensor 822 may be positioned on an inner extrusion 828 of the haptic device 116 and the sensing member 820 may be positioned within a cavity defined by the haptic device 116. As the keycap 108 is compressed, the haptic device 116 may correspondingly compress, bringing the sensor 822 closer towards the sensing member 820. In this embodiment, one or more shielding members or layers may be positioned on an outer or inner surface of the haptic device 116, which may at least partially isolate the sensing member 820 from outside signals and/or noise.

In still other embodiments, the sensor 822 may be operably connected to or integrated with the support mechanism 110. For example, if the sensor mechanism 110 is metal or includes a metal material, the sensing member 820 may be able to detect changes in the height of the supports 112, 114. Similarly, the keycap 108 may also be metal or include metal materials, and the sensing member 820 may detect changes of position, a finger positioned on the keycap 108, or the like. Moreover, the haptic device 116 may include metal or metal materials and the sensing mechanism 820 may be positioned to be in communication with the haptic device 116 to detect changes in position of the haptic device 116.

In embodiments where the sensor 822 and the sensing mechanism 820 sense changes in capacitance, many different types of inputs to the key 106 may be sensed. In one example, the keyboard 102 may determine if a user swipes his or her hand over the keys 106, which could be used as an input gesture for the computing device 100. Similarly, the keys 106 may sense when a user has placed his or her finger 801 on top of the keycap 108 and thus could detect finger position, although a user may not apply a force to depress the keycap 108. Additionally, the sensing mechanism 820 may be able to determine the speed at which the keycap 108 is depressed, the amount of force applied to the keycap 108, and the like. These different parameters may provide for different outputs by the keyboard 102. For example, a user may apply different gestures to the keyboard 102, similar to gestures applied to captive touch screens, by varying the force applied to a key 106, the symbol may be modified (e.g., force under a certain level may correspond to a lower case letter and force above a certain level may correspond to a capitalized letter), and so on.

Furthermore, in embodiments utilizing the sensing member 820, the haptic device and/or support member 110 may be eliminated. For example, the keycap 108 may not be required to move mechanically in order to detect a user input. Rather, the sensing member 820 may detect a user's input on the surface o the keycap 108, or the like. Accordingly, the key aperture 128 for receiving the key 106 and allowing the keycap 108 to move vertically may be covered, reduced, and/or eliminated. The lack of a mechanical connection may allow for faster typing (a user may not have to exert a pressure downward to select a key) and the keyboard 102 may be more resistant to liquid. Typical keyboards may be susceptible to liquids, as the key aperture 128 may expose the sensor membrane 122, illumination panel 120, and other electrical components to liquids spilled or otherwise present on the keyboard 102.

Bonding

In some embodiments, the base 134 may be operably connected to the enclosure 104. As described briefly above, in some embodiments, various elements of the base 134 may be attached the enclosure 104 by fasteners or bonding. FIG. 22 is a simplified cross-section view of the key 106 illustrating the adhesive layer 124 operably connecting the feature plate 118 to the enclosure 104. As described above, the feature plate 118 may be operably connected to the illumination panel 120 and/or the sensor membrane 122. Accordingly, by operably connecting the feature plate 118 to the enclosure 104, the other layers may also be operably connected to the enclosure 104. Additionally or alternatively, one more of the layers may also be attached to the enclosure 104 by the adhesive layer 124.

The adhesive 124 may reduce the vertical height of the key stack 130, as the adhesive 124 may have a thinner vertical thickness as compared with the vertical height of a fastener. This is because the bond of the adhesive 124 may be spread laterally, across surfaces already contributing to the vertical height (e.g., feature plate 118), but may be spread thinly so as to not add a significant amount of thickness to the key stack 130. Furthermore, assembly and manufacturing the keyboard 102 may be easier than typical keyboards that may require fasteners. For example, the various components and layers of the key stack 130 can be press-fit or placed on top of each other and the adhesive 124 may secure them together. Also, the adhesive 124 may be easier to apply to small components and/or components having complicated geometries than typical fasteners.

The foregoing description has broad application. For example, while examples disclosed herein may focus on a keyboard, it should be appreciated that the concepts disclosed herein may equally apply to other input devices. Similarly, although the various embodiments may be discussed with respect to the keyboard, any of the separate features of the keyboard may be used separately or integrated together. Accordingly, the discussion of any embodiment is meant only to be an example and is not intended to suggest that the scope of the disclosure, including the claims, is limited to these examples.

What is claimed is:

1. An input device configured to communicate with a computing device comprising:
   at least one keycap;
   a support mechanism operably connected to the keycap and configured to move the keycap from a first position to a second position;
   a feature plate having at least one anchoring mechanism operably connected to the support mechanism; and
   an illumination panel operably connected to the support mechanism and in optical communication with at least a portion of the at least one keycap; wherein
   the illumination panel is positioned between the at least one keycap and the feature plate; and
   the at least one anchoring member extends through a portion of the illumination panel.

2. The input device of claim 1, wherein the feature plate further includes at least one channel and the illumination panel is positioned within the channel.

3. The input device of claim 2, wherein the channel comprises a base member, a first angled extension that extends upwardly at an angle from a first side of the base member, a second angled extension that extends upwardly at an angle from a second side of the base member, a first leg member attached to the first angled extension that is substantially parallel to the base member, and a second leg member attached to the second angled extension that is substantially parallel to the base member.

4. The input device of claim 2, wherein a first space is defined between an edge of the illumination panel and a top corner formed by at least one of the first angled extension and the first leg member or the second angled extension and the second leg member.

5. The input device of claim 1, wherein the illumination panel is operably connected to the feature plate utilizing at least one of adhesive, at least one fastener, or the at least one anchoring member.

6. The input device of claim 1, wherein the at least one anchoring member forms at least one barrier wall for the illumination panel that reflects light from the illumination panel at least one of back into the illumination panel or towards the at least one keycap.

7. The input device of claim 6, wherein the at least one barrier wall performs at least one of concentrating the light from the illumination panel under the at least one keycap or preventing the light from the illumination panel from being emitted around a side of the at least one keycap.

8. The input device of claim 1, wherein the illumination panel includes at least one sensor that detects at least one input to the at least one keycap.

9. The input device of claim 1, wherein the illumination panel directs or emits light for multiple keycaps including the at least one keycap.

10. The input device of claim 1, wherein the illumination panel comprises at least one of a light guide for directing light emitted by at least one light source, a light pipe for directing the light emitted by the at least one light source, or a light source.

11. An input device configured to communicate with a computing device comprising:
    a keycap;
    a support mechanism operably connected to the keycap and configured to move the keycap from a first position to a second position;
    a support plate operably connected to the support mechanism; and
    an illumination panel operably connected to the support mechanism and in optical communication with at least a portion of the keycap, the illumination panel comprising
    a light source;
    a light guide optically coupled to the light source; and
    a frame substantially surrounding the light guide; wherein
    light illuminated from the light source is directed by the light guide and the frame towards the keycap.

12. The input device of claim 11, wherein the support plate comprises a substrate that supports at least one electrical connection.

13. The input device of claim 11, wherein the illumination panel is integrated into the support plate.

14. The input device of claim 11, wherein the frame comprises at least one material that is not light transmissive.

15. The input device of claim 11, wherein illumination panel occupies substantially a same area as the keycap.

16. The input device of claim 11, further comprising a plurality of keycaps that includes the keycap wherein the only keycap of the plurality of keycaps that receives light from the illumination panel is the keycap.

17. The input device of claim 16, further comprising at least one additional illumination panel operably connected to at least one keycap of the plurality of keycaps other than the keycap wherein the at least one additional illumination panel is in optical communication with at least a portion of the at least one keycap of the plurality of keycaps other than the keycap.

18. The input device of claim 11, wherein the frame prevents light leakage from around the keycap.

19. The input device of claim 11, further comprising at least one retaining features that secure the frame to the illumination panel.

20. The input device of claim 11, wherein the frame reflects the light towards at least one of the keycap or the illumination panel.

* * * * *